(12) United States Patent
Athey et al.

(10) Patent No.: US 7,842,338 B2
(45) Date of Patent: *Nov. 30, 2010

(54) METHODS OF OBTAINING PHOTOACTIVE COATINGS AND/OR ANATASE CRYSTALLINE PHASE OF TITANIUM OXIDES

(75) Inventors: Pat Ruzakowski Athey, Cheswick, PA (US); James J. Finley, Pittsburgh, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/971,305

(22) Filed: Jan. 9, 2008

(65) Prior Publication Data

US 2008/0124460 A1  May 29, 2008

Related U.S. Application Data

(60) Division of application No. 10/409,517, filed on Apr. 8, 2003, now Pat. No. 7,323,249, which is a continuation-in-part of application No. 09/943,163, filed on Aug. 30, 2001, now Pat. No. 6,677,063.

(60) Provisional application No. 60/229,449, filed on Aug. 31, 2000.

(51) Int. Cl.
*B05D 5/06* (2006.01)

(52) U.S. Cl. ............... 427/165; 427/166; 427/255.36; 65/60.2; 65/60.5

(58) Field of Classification Search ................ 427/164, 427/165, 166, 167, 255.36; 65/60.2, 60.5
See application file for complete search history.

(56) References Cited

U.S. PATENT DOCUMENTS

| | | | | |
|---|---|---|---|---|
| 5,637,353 | A * | 6/1997 | Kimock et al. | 427/255.34 |
| 5,873,203 | A * | 2/1999 | Thiel | 52/172 |
| 5,930,046 | A * | 7/1999 | Solberg et al. | 359/580 |
| 6,054,227 | A * | 4/2000 | Greenberg et al. | 428/701 |
| 6,352,755 | B1 * | 3/2002 | Finley et al. | 428/100 |
| 6,482,537 | B1 * | 11/2002 | Strangman et al. | 428/633 |
| 6,677,063 | B2 * | 1/2004 | Finley | 428/701 |
| 6,679,996 | B1 * | 1/2004 | Yao | 216/40 |
| 7,521,871 | B2 * | 4/2009 | Ritz et al. | 313/635 |
| 2005/0233899 | A1 * | 10/2005 | Anzaki et al. | 502/350 |
| 2007/0031681 | A1 * | 2/2007 | Anzaki et al. | 428/432 |
| 2007/0254164 | A1 * | 11/2007 | Veerasamy et al. | 428/432 |

OTHER PUBLICATIONS

Rahtu, Antti, et al., "Atomic Layer Deposition of Zirconium Titanium Oxide from Titanium Isopropoxide and Zirconium Chloride". Chem. Mater. 2001, 13, pp. 1528-1532.*

* cited by examiner

*Primary Examiner*—Bret Chen
(74) *Attorney, Agent, or Firm*—Andrew C. Siminerio

(57) ABSTRACT

A method of making a photoactive coating includes depositing a first coating material containing zirconium oxide over at least a portion of a substrate and depositing a second coating material containing titanium oxide over at least a portion of the first coating material to provide a coated substrate. At least one of the first and second coating materials is deposited by pyrolytic deposition.

15 Claims, 11 Drawing Sheets

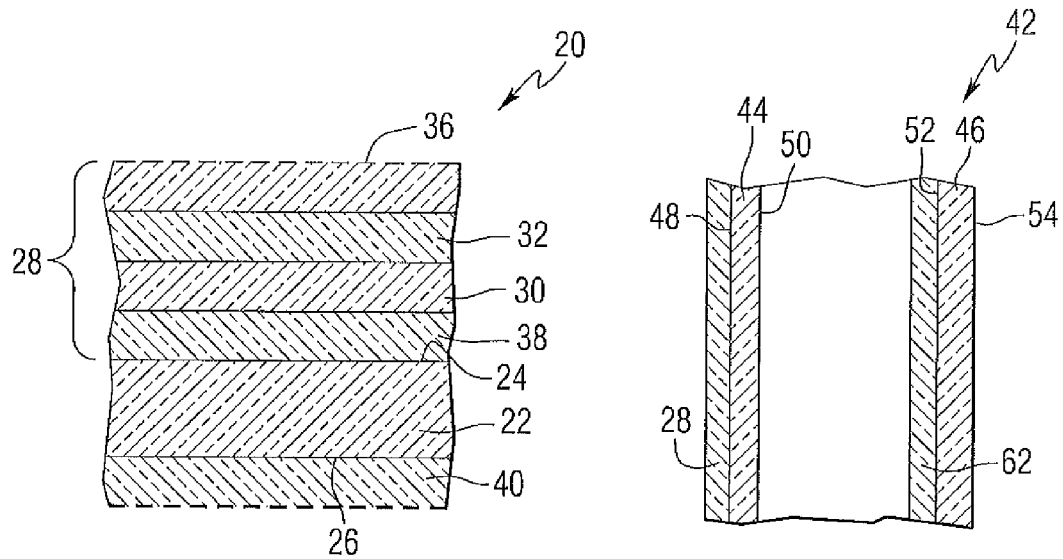
FIG. 1
FIG. 2
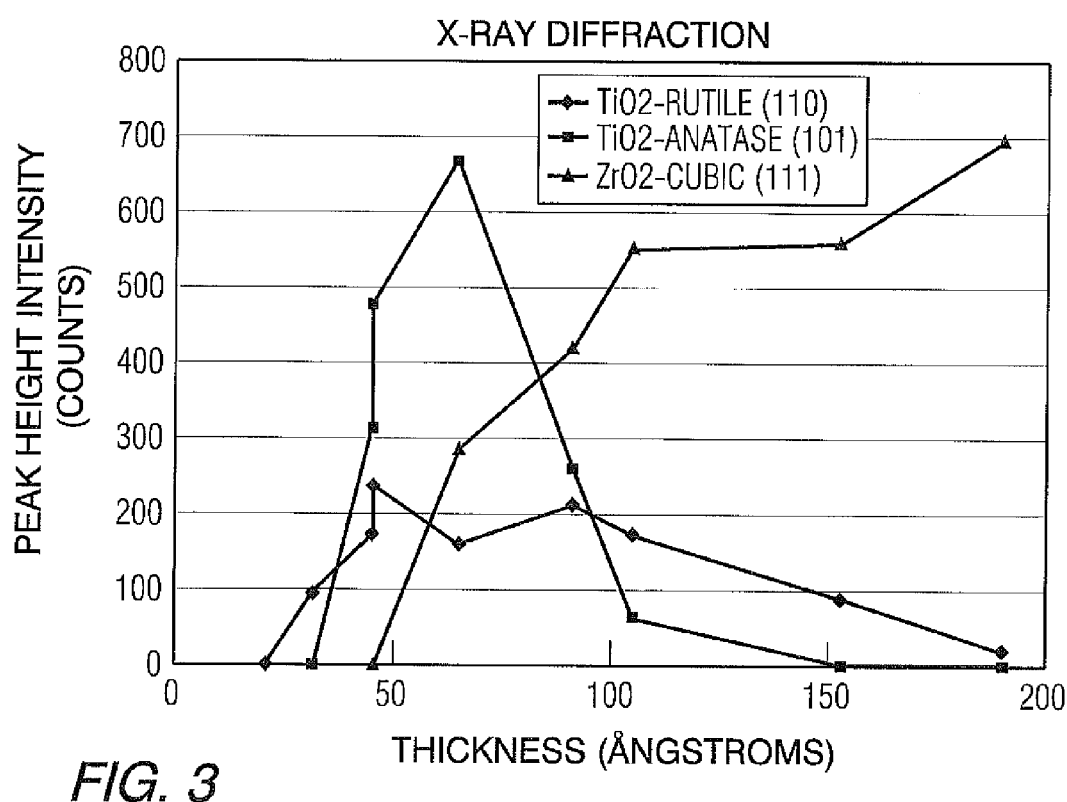
FIG. 3

(SAMPLE 46)

(SAMPLE 47)

(SAMPLE 48)

(SAMPLE 49)

(SAMPLE 50)

(SAMPLE 51)

*(SAMPLE 52)*

*(SAMPLE 53)*

(SAMPLE 46)

(SAMPLE 47)

(SAMPLE 48)

(SAMPLE 49)

(SAMPLE 50)

(SAMPLE 51)

(SAMPLE 52)

(SAMPLE 53)

US 7,842,338 B2

METHODS OF OBTAINING PHOTOACTIVE COATINGS AND/OR ANATASE CRYSTALLINE PHASE OF TITANIUM OXIDES

CROSS-REFERENCE TO RELATED APPLICATION

This application is a divisional of U.S. application Ser. No. 10/409,517 filed Apr. 8, 2003 now U.S. Pat. No. 7,323,249; which is a continuation-in-part of U.S. application Ser. No. 09/943,163 filed Aug. 30, 2001, now U.S. Pat. No 6,677,063; which claimed the benefits of U.S. Provisional Application Ser. No. 60/229,449 filed Aug. 31, 2000, all of which applications are herein incorporated by reference in their entirety.

BACKGROUND OF THE INVENTION

1. Field of the Invention

This invention relates to photoactive coatings and, in one aspect, to methods of changing or obtaining the phase of a material, e.g., an anatase crystalline phase of an oxide of titanium, such as titanium dioxide, from an amorphous phase of titanium oxide or from titanium metal. In another aspect, the invention relates to methods of obtaining a photoactive, e.g., photoactively hydrophilic and/or photocatalytic coating, and/or to articles made thereby.

2. Technical Considerations

For many substrates, e.g., glass substrates such as architectural windows, automotive transparencies, and aircraft windows, it is desirable that the surface of the substrate is substantially free of surface contaminants, such as common organic and inorganic surface contaminants, for as long a duration as possible. Traditionally, this has meant that these surfaces are cleaned frequently. This cleaning operation is typically performed by manually wiping the surface with or without the aid of chemical cleaning solutions. This approach can be labor, time, and/or cost intensive. Therefore, a need exists for methods to clean glass substrates that reduce the frequency and/or need for such manual cleaning operations.

It is known that certain semiconductor metal oxides provide a photoactive (hereinafter "PA") coating. The terms "photoactive" or "photoactively" refer to the photogeneration of a hole-electron pair when illuminated by electromagnetic radiation of a particular frequency, typically ultraviolet ("UV") light. Above a certain minimum thickness, these PA coatings are typically photocatalytic (hereinafter "PC"). By "photocatalytic" is meant a coating which upon exposure to certain electromagnetic radiation, such as UV, interacts with organic contaminants on the coating surface to degrade or decompose the organic contaminants. With sufficient PC activity, these PC coatings are also self-cleaning. By "self-cleaning" is meant having sufficient PC activity to decompose organic contaminants fast enough that manual wiping to remove organic contaminants is not required. In addition, PC coatings are also typically hydrophilic. By "hydrophilic" is meant water wetting with a contact angle with water of generally less than 20 degrees. The hydrophilicity of the PC coatings helps reduce fogging, i.e., the accumulation of water droplets on the coating, which may decrease visible light transmission and visibility through the coated substrate.

Titanium dioxide ($TiO_2$) coatings are known to have hydrophilic and/or self-cleaning properties. However, not all phases of titanium dioxide are acceptable for providing self-cleaning and/or hydrophilic coatings. It is currently preferred to use the anatase crystalline phase rather than the amorphous phase or rutile crystalline phase of titanium dioxide to form PC coatings.

Sputter coating titanium dioxide, e.g., as a protective overcoat, has been used and is disclosed in U.S. Pat. No. 4,716,086. A limitation of conventionally sputter depositing titanium dioxide is that the anatase crystalline phase is not obtained. Another limitation is that sputter depositing a metal film is more efficient than depositing a metal oxide film. In the instance where a metal oxide film is desired, an efficient method is to sputter deposit a metal film on a substrate, and thereafter heat the deposited metal film in air. In the case of sputter deposited titanium metal film, the oxide film formed after heating is usually not the anatase phase but rather the rutile phase of titanium dioxide. Publications directed to the formation of titanium dioxide coatings on a glass substrate include U.S. Pat. Nos. 5,595,813 and 6,027,766, and "Photooxidative Self-cleaning Transparent Titanium Dioxide Films on Glass", Paz et al., J. Mater. Res., Vol. 10, No. 11, pp. 2842-48 (November 1995).

Another known method of depositing metal oxide films is by pyrolytic deposition, e.g., spray pyrolysis. Pyrolytic deposition has some advantages over MSVD deposition. For example, spray pyrolysis typically is less costly and poses fewer environmental concerns than MSVD processes. However, materials such as titania typically show little if any photocatalytic activity when pyrolytically deposited directly onto a glass substrate.

As can be appreciated, it would be advantageous to provide a method of making a pyrolytically deposited hydrophilic and/or photocatalytic coating, e.g., a titanium dioxide-containing coating.

SUMMARY OF THE INVENTION

In one aspect of the invention, methods are provided for making a photoactive, e.g., photoactively hydrophilic and/or photocatalytic, coating. One method for making a photoactive coating includes depositing a first coating layer, e.g., a coating layer comprising zirconium oxide, over at least a portion of a substrate and depositing a second coating layer, e.g., a coating layer comprising a photoactive material, such as titanium dioxide, over at least a portion of the first coating layer to provide a coated substrate. The first and/or second coating layers can be applied by pyrolytic deposition. In one embodiment, the method includes heating at least one of the substrate, and/or the first coating layer, and/or the second coating layer to make the photoactive article. The presence of the first coating layer can enhance the photoactive properties of the second coating.

The invention also relates to articles, e.g., windows for residential and commercial use, windows for land, air, sea, space and underwater vehicles, made using coated substrates of the invention. In one embodiment, the article includes a substrate, a first coating layer, e.g., a zirconium oxide-containing layer, deposited over at least a portion of the substrate, e.g., by pyrolytic deposition, and a second coating layer, e.g., a titanium dioxide-containing layer, deposited over the zirconium oxide layer, e.g., by pyrolytic deposition. In one embodiment, the first coating layer can have a thickness in the range of 10 Å to 500 Å, e.g., 100 Å to 400 Å, e.g., 100 Å to 300 Å, and the second coating layer can have a thickness in the range of 10 Å to 500 Å, such as 100 Å to 400 Å, such as 100 Å to 300 Å.

One particular method of making a transparency comprises: providing a glass substrate having at least one surface; pyrolytically depositing a first continuous film comprising zirconium oxide in the cubic, baddeleyite or orthorhombic crystalline phase directly on substantially all of the glass substrate surface; and pyrolytically depositing a second continuous film comprising a material selected from at least one metal oxide or semiconductor metal oxide on substantially all of the first film.

Another method of making a transparency comprises: providing a glass substrate having at least one surface; pyrolytically depositing a first continuous layer comprising zirconium oxide in the cubic, baddeleyite or orthorhombic crystalline phase directly on substantially all of the substrate; and pyrolytically depositing a second continuous layer comprising titanium oxide on substantially all of the first layer.

A further method of making a coated substrate comprises: providing a glass substrate having at least one surface; pyrolytically depositing a first continuous layer comprising zirconium oxide in the cubic, baddeleyite or orthorhombic crystalline phase in contact with at least a portion of the glass substrate surface; and depositing a second continuous layer comprising a material selected from at least one metal oxide or semiconductor metal oxide on substantially all of the first layer.

BRIEF DESCRIPTION OF THE DRAWINGS

FIG. 1 is a fragmented side, sectional view (not to scale) of a substrate having a coating stack incorporating features of the invention;

FIG. 2 is a side, sectional view (not to scale) of an insulating glass unit having a coating stack of the invention;

FIG. 3 is a graph having curves of film thickness versus peak height counts for cubic zirconium oxide phase, rutile titanium oxide phase, and anatase titanium oxide phase;

DETAILED DESCRIPTION OF THE INVENTION

Figure 4:
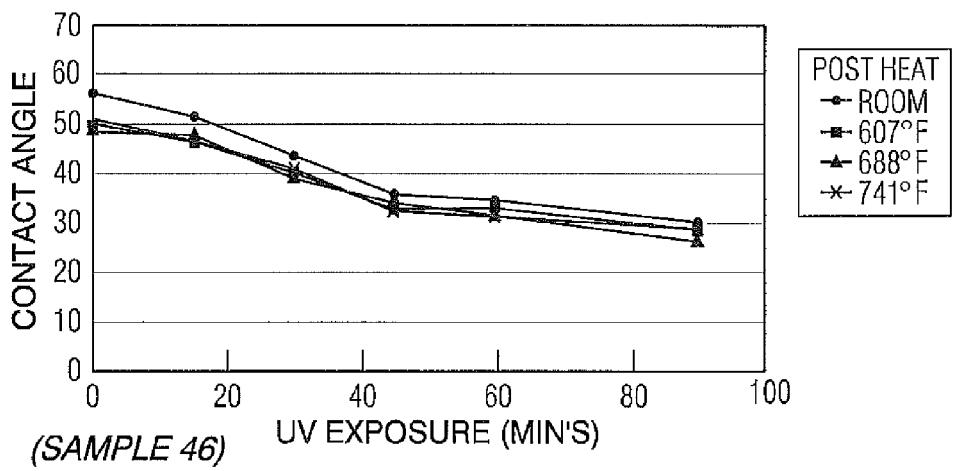
FIGS. 4-11 are graphs showing the contact angle of a water droplet versus minutes of exposure to ultraviolet radiation for titanium dioxide coatings (FIGS. 4-7) and various coatings incorporating features of the invention (FIGS. 8-11)
Figure 5:
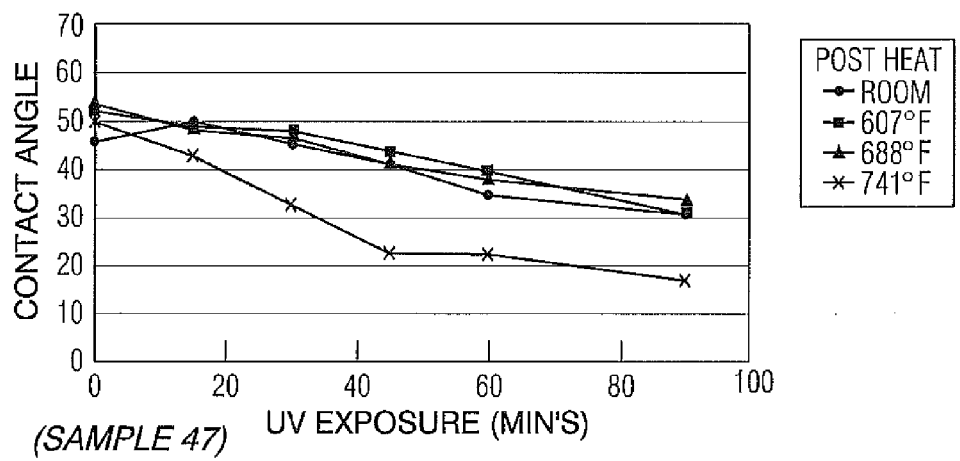
Figure 6:
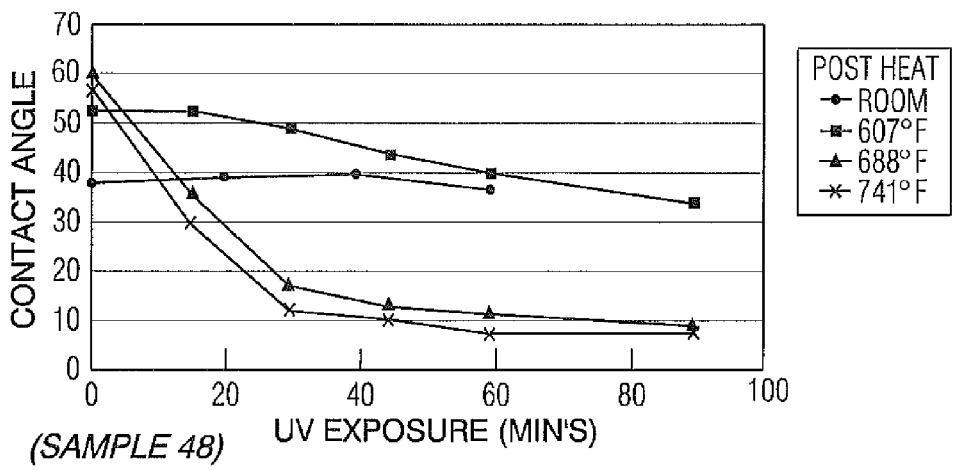
Figure 7:
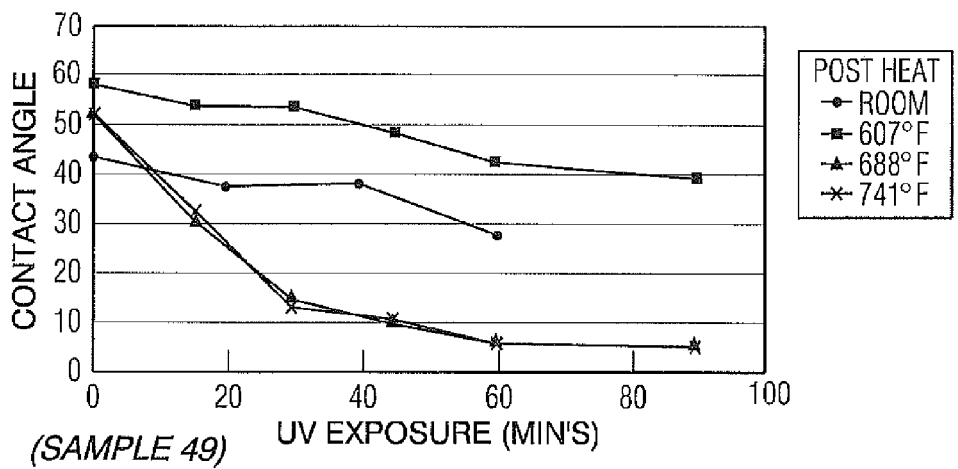
Figure 8:
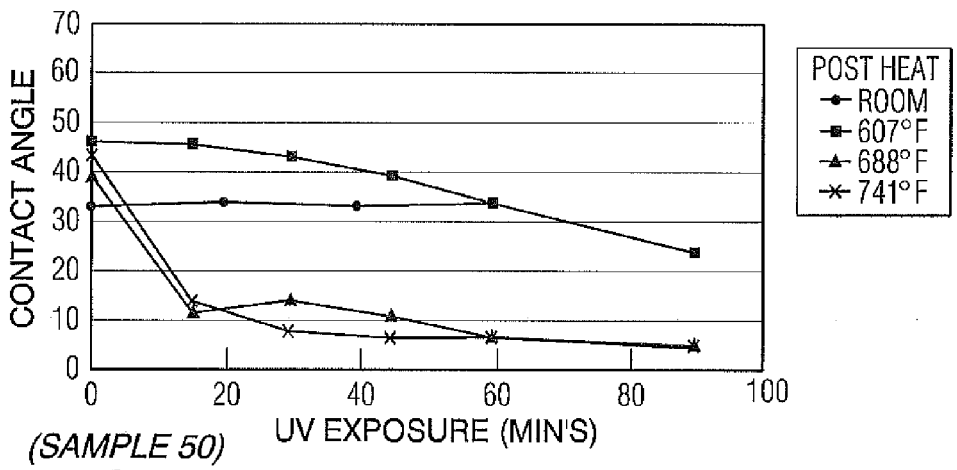

As used herein, spatial or directional terms, such as "inner", "outer", "above", "below", "top", "bottom", and the like, relate to the invention as it is shown in the drawing figures. However, it is to be understood that the invention may assume various alternative orientations and, accordingly, such terms are not to be considered as limiting. Further, all numbers expressing dimensions, physical characteristics, processing parameters, quantities of ingredients, reaction conditions, and the like used in the specification and claims are to be understood as being modified in all instances by the term "about". Accordingly, unless indicated to the contrary, the numerical values set forth in the following specification and claims are approximations that may vary depending upon the desired properties sought to be obtained by the present invention. At the very least, and not as an attempt to limit the application of the doctrine of equivalents to the scope of the claims, each numerical value should at least be construed in light of the number of reported significant digits and by applying ordinary rounding techniques. Moreover, all ranges disclosed herein are to be understood to include the beginning and ending values and to encompass any and all subranges subsumed therein. For example, a stated range of "1 to 10" should be considered to include any and all subranges between (and inclusive of) the minimum value of 1 and the maximum value of 10; that is, all subranges beginning with a minimum value of 1 or more and ending with a maximum value of 10 or less, e.g., 5.5 to 10. Further, as used herein, terms such as "deposited over" or "formed over" mean deposited or formed on but not necessarily in contact with the surface. For example, a coating "deposited over" a substrate does not preclude the presence of one or more other coating films of the same or different composition located between the deposited coating and the substrate. Additionally, all percentages disclosed herein are "by weight" unless indicated to the contrary. All documents referred to herein are to be understood to be incorporated by reference in their entirety. All photocatalytic activity values discussed herein are those determined by the conventional stearic acid test described in U.S. Pat. No. 6,027,766.

Referring now to FIG. 1, there is shown an article 20 having features of the present invention. The article 20 includes a substrate 22 having a first surface 24 and an opposite or second surface 26. The substrate 22 is not limiting to the invention and can be of any desired material having any desired characteristics, such as opaque, translucent, or transparent substrates. By "transparent" is meant having a visible light transmittance of greater than 0% up to 100%. By "visible light" is meant electromagnetic energy in the range of 395 nanometers (nm) to 800 nm. By "translucent" is meant allowing electromagnetic energy (e.g., visible light) to pass through the substrate but diffusing this energy such that objects on the side of the substrate opposite to the viewer are not clearly visible. By "opaque" is meant having a visible light transmittance of 0%. Additionally, the substrate 22 can be of any desired shape, such as flat or curved. Examples of suitable substrates include, but are not limited to, plastic substrates (such as polyacrylates, polycarbonates, and polyethyleneterephthalate (PET)); metal substrates; ceramic substrates; glass substrates; or mixtures or combinations thereof. For example, the substrate can be conventional untinted soda-lime-silica glass, i.e., "clear glass", or can be tinted or otherwise colored glass, borosilicate glass, leaded glass, and/or tempered, untempered, annealed, or heat strengthened glass. The glass may be of any type, such as conventional float glass, flat glass, or a float glass ribbon, and may be of any composition having any optical properties, e.g., any value of visible transmission, ultraviolet transmission, infrared transmission, and/or total solar energy transmission. Types of glass suitable for the practice of the invention are described, for example but not to be considered as limiting, in U.S. Pat. Nos. 4,746,347; 4,792,536; 5,240,886; 5,385,872; and 5,393,593. For example, the substrate 22 can be a glass pane of an architectural window, a skylight, one pane of an insulating glass unit, or a ply for a conventional automotive windshield, side or back window, sun roof, or an aircraft transparency, just to name a few.

The substrate 22 can have a coating stack or coating 28 of the invention deposited over all or at least a portion of the substrate 22, e.g.; over all or a portion of the surface 24 to make a substantially transparent article, a substantially translucent article, or a substantially opaque article. As used herein, the terms "film" or "coating film" refer to a region of the coating having a desired or selected coating composition. A coating "layer" comprises one or more coating films. The terms "coating" or "coating stack" can include one or more coating layers. The coating 28 can be photocatalytic, photoactively hydrophilic, or both. By "photoactively hydrophilic" or "photohydrophilic" is meant a coating on which the contact angle of a water droplet decreases with time as a result of exposure of the coating to electromagnetic radiation within the photoabsorption band of the coating. By "photoabsorption band" is meant that wavelength or range of wavelengths of the electromagnetic spectrum which causes a material to be photoactive, e.g., photocatalytic and/or photoactively hydrophilic. If photoactively hydrophilic, the coating 28 may not necessarily be photocatalytic.

The exemplary coating 28 of the invention shown in FIG. 1 includes a first film 30 deposited over, e.g., on, at least a portion of the surface 24 of the substrate 22 and a second film 32 deposited over, e.g., on, at least a portion of the first film 30. In this illustrated non-limiting exemplary coating 28, the first and second films 30, 32 are shown as discrete coating layers, i.e., the coating 28 is not a mixture of the materials of the first and second films 30, 32. In one embodiment, the first film 30 can include a material that enhances the photoactivity, e.g., photoactive hydrophilicity and/or photocatalytic activity, of the second film 32 over that of the second film 32 alone. In another embodiment, the first film 30 can include a material that facilitates or enhances the growth of a particular crystalline phase of the second film 32. The first film 30 can be the same film (i.e., can be of the same material) to achieve both of these goals or different materials can be used.

The first coating material or film 30 can include any material and can be of any thickness to provide one or more of the results described above. For example, the first film 30 can include at least one metal oxide. As used herein, the term "metal oxide" includes oxides, super-oxides, or sub-oxides of the metal. For example, as used herein, terms such as "zirconium oxide", "titanium oxide", and the like are to be understood to include dioxides, sub-oxides, and super-oxides and combinations of these with other materials, such as zirconium hafnium oxide, and/or oxynitrides, such as titanium oxynitride. In one exemplary embodiment, the first film 30 is or includes zirconium oxide, e.g., zirconium dioxide ($ZrO_2$). The zirconium oxide film can be sufficiently thick so as to achieve one or more of the above-described goals. In one embodiment, the zirconium oxide first film 30 can have a thickness greater than 0 Å, such as greater than or equal to 15 Å, such as greater than or equal to 25 Å, such as in the range of 25 Å to 500 Å. For example, the zirconium oxide film 30 can have a thickness in the ranges of 25 Å to 150 Å; 40 Å to 80 Å; and/or 60 Å to 70 Å. In another exemplary embodiment, the zirconium oxide film 30 can have a thickness greater than or equal to 100 Å, e.g., in the range of 100 Å to 500 Å, e.g., 100 Å to 300 Å, e.g., 120 Å to 200 Å, e.g., 140 Å to 160 Å.

The second coating material or film 32 can include a photoactive material. The photoactive material can include at least one metal oxide, such as but not limited to, one or more metal oxides or semiconductor metal oxides. Suitable metal oxides include, but are not limited to, titanium oxides, silicon oxides, iron oxides, tungsten oxides, zinc oxides, tin oxides, zinc/tin oxides, calcium titanium oxides, molybdenum oxides, niobium oxides, and mixtures thereof, just to name a few. The second film 32 can be crystalline or at least partially crystalline. However, crystallinity is not necessarily needed to achieve photoactive hydrophilicity.

In one exemplary coating 28 of the invention, the photoactive coating material of the second film 32 is or includes titanium dioxide ($TiO_2$). Titanium dioxide can exist in an amorphous form or one of three crystalline forms, i.e., the anatase, rutile, and brookite crystalline forms. Anatase phase titanium dioxide is particularly useful because it exhibits strong photoactivity while also possessing excellent resistance to chemical attack and excellent physical durability. The second film 32 can have any desired thickness. In one exemplary embodiment, a titanium dioxide second film has a thickness greater than or equal to 100 Å, e.g., greater than or equal to 200 Å, e.g., in the range of 100 Å to 500 Å, e.g., 300 Å to 400 Å. In another exemplary embodiment, a titanium dioxide-containing second film can have a thickness in the range of 100 Å to 500 Å, such as 100 Å to 400 Å, such as 100 Å to 300 Å.

The first and second films 30, 32 of the coating 28 can be sufficiently thick so as to provide an acceptable level of photoactivity, e.g., photocatalytic activity and/or photoactive hydrophilicity, for a desired purpose. There is no absolute value which renders the coating 28 "acceptable" or "unacceptable" because whether the coating 28 has an acceptable level of photoactivity varies depending largely on the purpose and conditions under which the coated article is being used and the performance standards selected to match that purpose. However, the thickness of the coating 28 to achieve photoactive hydrophilicity can be much less than is needed to achieve a commercially acceptable level of photocatalytic activity. For example, the zirconium oxide/titanium oxide coating described above can have any desired thickness. However, for most automotive uses, the coating 28 should not be so thick that it cannot be seen through. For example, the coating 28 can have a total thickness of 50 Å to 5000 Å. As the coating thickness decreases in such ranges as 50 Å to 3000 Å, e.g., 100 Å to 1000 Å, e.g., 200 Å to 600 Å, e.g., 200 Å to 300 Å, photocatalytic activity may be very low or even unmeasurable by the conventional stearic acid test but photoactive hydrophilicity may still be present in the presence of electromagnetic radiation within the photoabsorption band of the photoactive material.

The coating 28 can be an outer or the outermost coating of a multi-layer stack of coatings present on substrate 22 or the coating 28 can be embedded as one of the coatings other than the outermost coating within such a multi-layer stack. For example, as shown in FIG. 1, an optional temporary or removable protective material or protective film 36 can be applied over all or a portion of the coating 28. The protective film 36 can include, for example, an organic material such that upon exposure of the coated substrate 22 to electromagnetic energy within the photoabsorption band of the photoactive material of the second film 32, at least a portion of the protective film 36 will be photocatalytically removed from the outer surface of the coating 28. This protective film 36 can be applied to form a desired pattern on the coating 28 and can be transparent, translucent, or opaque.

The coating 28 can be deposited directly on, i.e., in contact with, the surface 24 of the substrate 22. Alternatively, one or more optional functional coatings 38 can be interposed between the coating 28 and the substrate 22. As used herein, the term "functional coating" refers to a coating which modifies one or more physical properties of the substrate on which it is deposited, e.g., optical, thermal, chemical or mechanical properties, and is not intended to be removed from the substrate during subsequent processing. The functional coating 38 may have one or more functional coating films of the same or different composition or functionality. The functional coating 38 may be an electrically conductive coating, such as, for example, an electrically conductive heated window coating as disclosed in U.S. Pat. Nos. 5,653,903 and 5,028,759, or a single-film or multi-film coating. Likewise, the functional coating 38 may be a solar control coating, for example, a visible, infrared or ultraviolet energy reflecting or absorbing coating. Examples of suitable solar control coatings are found, for example, in U.S. Pat. Nos. 4,898,789; 5,821,001; 4,716,086; 4,610,771; 4,902,580; 4,716,086; 4,806,220; 4,898,790; 4,834,857; 4,948,677; 5,059,295; and 5,028,759, and also in U.S. patent application Ser. No. 09/058,440. Similarly, the functional coating 38 can be a low emissivity coating. "Low emissivity coatings" allow visible wavelength energy, e.g., 395 nm to about 800 nm (e.g., to about 780 nm), to be transmitted through the coating but reflect longer-wavelength solar infrared energy and/or thermal infrared energy and are typically intended to improve the thermal insulating properties of architectural glazings. By "low emissivity" is meant emissivity less than 0.4, such as less than 0.3, such as less than 0.2. Examples of low emissivity coatings are found, for example, in U.S. Pat. Nos. 4,952,423 and 4,504,109 and British reference GB 2,302,102. The functional coating 38 can be a single layer or multiple layer coating and may comprise one or more metals, non-metals, semi-metals, semiconductors, and/or alloys, compounds, composites, combinations, or blends thereof. For example, the functional coating 38 may be a single layer metal oxide coating, a multiple layer metal oxide coating, a non-metal oxide coating, or a multiple layer coating. The functional coating 38 may include one or more transparent conductive oxides (such as indium tin oxide or tin oxide) or doped metal oxides (such as tin oxide doped with fluorine or antimony). Moreover, the functional coating 38 can include one or more nitrides (such as titanium nitride, silicon nitride, or zirconium nitride), borides (such as titanium diboride), or carbides (such as titanium carbide). Additionally or alternatively, another optional functional coating 40 can be deposited over all or a portion of the second surface 26.

Examples of suitable functional coatings for use with the invention are commercially available from PPG Industries, Inc. of Pittsburgh, Pa. under the SUNGATE® and SOLARBAN® families of coatings. Such functional coatings typically include one or more anti-reflective coating films comprising dielectric or anti-reflective materials, such as metal oxides or oxides of metal alloys, which are preferably transparent or substantially transparent to visible light. The functional coating(s) may also include infrared reflective films comprising a reflective metal, e.g., a noble metal such as gold, copper or silver, or combinations or alloys thereof, and may further comprise a primer film or barrier film, such as titanium, as is known in the art, located over and/or under the metal reflective layer.

An exemplary article of manufacture of the invention is shown in FIG. 2 in the form of an insulating glass (IG) unit 42. The insulating glass unit has a first pane 44 spaced from a second pane 46 by a spacer assembly (not shown) and held in place by a sealant system to form a chamber between the two panes 44,46. The first pane 44 has a first surface 48 (number 1 surface) and a second surface 50 (number 2 surface). The second pane 46 has a first surface 52 (number 3 surface) and a second surface 54 (number 4 surface). The first surface 48 can be the exterior surface of the IG unit 42, i.e., the surface exposed to the environment, and the second surface 54 can be the interior surface, i.e., the surface forming the inside of the structure. Examples of IG units are disclosed in U.S. Pat. Nos. 4,193,236; 4,464,874; 5,088,258; and 5,106,663, herein incorporated by reference. A coating 28 of the invention can be deposited over one or more of the surfaces (any one or more of the number 1 to number 4 surfaces). In the non-limiting embodiment shown in FIG. 2, the coating 28 is positioned on the number 1 surface 48. The coating 28 can reduce fogging and can make the IG unit 42 easier to clean and maintain. One or more optional functional coatings 62 as described above may be deposited over one or more of the surfaces (number 1 to number 4), e.g., the number 2, number 3, or number 4 surfaces.

One or both of the films 30,32 of the coating 28 of the invention can be formed on the substrate 22 by any conventional method, such as but not limited to spray pyrolysis, chemical vapor deposition (CVD), or magnetron sputtered vacuum deposition (MSVD). For example, both films 30,32 may be deposited by the same method or one film may be deposited by one method and one or more of the other films of the coating 28 may be deposited by one or more other methods. Each of the methods has advantages and limitations depending upon the desired characteristics of the coating 28 and the type of glass fabrication process. For example, for a conventional float glass process the CVD and spray pyrolysis methods may be preferred over the MSVD method because they are more compatible with coating continuous substrates, such as float glass ribbons, at elevated temperatures. Exemplary CVD and spray pyrolysis coating methods are described in U.S. Pat. Nos. 4,344,986; 4,393,095; 4,400,412; 4,719,126; 4,853,257; 5,536,718; 5,464,657; 5,714,199; 5,599,387; and 4,971,843. For example, for pyrolytic deposition, the substrate and/or the coated substrate can be heated to a temperature of at least 200° C., such as at least 300° C., such as at least 400° C., such as at least 500° C., such as at least 600° C., such as in the range of 400° C. to 800° C., to form the deposited coating(s).

U.S. Pat. Nos. 4,379,040; 4,861,669; 4,900,633; 4,920,006; 4,938,857; 5,328,768; and 5,492,750 describe MSVD apparatus and methods to sputter coat metal oxide films on a substrate, including a glass substrate. The MSVD method is acceptable to deposit one or more of the coating films 30, 32 on the substrate 22, e.g., a glass sheet. In one embodiment, the substrate 22 may be heated prior to deposition of one or more of the coating films, e.g., films 30 and/or 32. Alternatively or in addition thereto, the substrate 22 can be heated during the sputtering process itself.

In one embodiment, the coating 28 can be sputter deposited on the first surface 24 of the substrate 22 and the functional coating 40 deposited on the second surface 26 in the same coater. International Publication WO 00/37377 discloses a sputtering method which is suitable for this embodiment. As will be appreciated, since the sputtering takes place in a vacuum, the substrate 22 can be in any orientation during the sputtering process of this embodiment of the invention as long as the targets for deposition of the coating 28 and the functional coating 40 are on opposite sides of the substrate 22.

An exemplary method to provide a coating 28 by an MSVD process will now be described. A substrate 22, such as a glass substrate, can be preheated prior to deposition of the coating 28. For example, the substrate can be heated to a temperature greater than or equal to 100° F. (38° C.), such as in the range of about 100° F. to 1000° F. (38° C. to 537° C.), such as greater than or equal to 150° F. (65° C.), 200° F. to 500° F. (93° C. to 260° C.), such as 300° F. to 400° F. (149° C. to 204° C.), prior to deposition of the coating 28 (i.e., the temperature of the substrate at the beginning of the coating process is within one of these temperature ranges). The heated substrate can then be placed in a conventional MSVD coating device having an argon/oxygen atmosphere, e.g., 5 vol. % to 100 vol. % oxygen, e.g., 5 vol. % to 50 vol. % oxygen, e.g., 20 vol. % oxygen, at a pressure of 5 to 10 millitorr. To deposit a zirconium oxide first film 30, a zirconium containing target can be sputtered in conventional manner to form a zirconium oxide first film 30 of a desired thickness. The zirconium containing target preferably includes 50 weight percent (wt. %) or more zirconium, e.g., 80 wt. % or more zirconium. However, the zirconium target can also include one or more other metals or dopants, such as boron, strontium, titanium, lead, barium, silicon, calcium, hafnium, lanthanum, chromium, vanadium, manganese, copper, iron, magnesium, scandium, yttrium, niobium, molybdenum, ruthenium, tantalum, tungsten, silver, nickel, rhenium, aluminum, or mixtures thereof, or the zirconium target can be a zirconium oxide target.

A titanium-containing target can then be used to form a titanium oxide (e.g., titanium dioxide) second film 32 over the zirconium oxide first film 30. If the coating is not crystallized, the coated substrate can be removed from the coater and heated to a temperature sufficient to form a crystalline coating. For example, the coated substrate can be heated to a temperature in the range of 100° C. (212° F.) to 650° C. (1200° F.), such as 400° C. (752° F.) to 650° C. (1200° F.), for a time period sufficient to promote formation of a crystalline form of titanium dioxide. Generally, less than an hour at a temperature in the range of 100° C. (212° F.) to 600° C. (1112° F.) is sufficient. Where the substrate 22 is a glass sheet cut from a float glass ribbon, the coating 28 may be sputter deposited on the air side and/or the tin side of the glass. Alternatively, the substrate 22 can be coated without preheating the substrate 22 prior to coating.

The substrate 22 having the coating 28 deposited by the CVD, spray pyrolysis or MSVD methods can be subsequently subjected to one or more post-coating heating operations, such as annealing or tempering. As may be appreciated, the time and temperatures of the post-heating may be affected by several factors, including the makeup of substrate 22, the makeup of coating 28, the thickness of the coating 28, and whether the coating 28 is directly in contact with the substrate 22 or is one layer of a multi-layer stack on substrate 22. Alternatively, in one exemplary embodiment of the invention discussed below under the heading FEATURE 2, a photoactive hydrophilic coating 28 can be formed by the practice of the invention without the need for any post-heating steps.

In the embodiment described immediately above, the coating films 30,32 were sputtered in an oxygen-containing atmosphere to form a metal oxide-containing coating 28. However, it is to be understood that the first and/or second films 30 and 32 can be sputtered as metal films in a non-reactive atmosphere, or in an active atmosphere below the switching point of the material as defined in U.S. Pat. No. 5,830,252 and U.S. patent application Ser. No. 09/156,730 to oxidize the metal films to metal oxide films.

The coatings 28 of the present invention can be photoactive, e.g., photocatalytic and/or photoactively hydrophilic, upon exposure to radiation in the photoabsorption band of the second coating material. In one embodiment, the photoabsorption band of the second coating material includes one or more wavelengths in the ultraviolet range, e.g., 300 nm to 395 nm and/or the visible range, e.g., 395 nm to 800 nm, of the electromagnetic spectrum. Sources of ultraviolet radiation include natural sources, e.g., solar radiation, and artificial sources such as a black light or an ultraviolet light source such as a UVA-340 light source commercially available from the Q-Panel Company of Cleveland, Ohio.

The present invention provides several features which make it advantageous for use in various industrial fields. Five of these features (crystalline phase selection, hydrophilicity, chemical durability, photocatalytic activity, and pyrolytic deposition) will now be discussed.

FEATURE 1 (Crystalline Phase Selection)

In one embodiment, the invention is directed to techniques or methods to alter or change the phase of a film. The term "phase" is used to describe crystallinity or non-crystallinity of the film. For example, the term "amorphous phase" means the film is totally or substantially amorphous, i.e., exhibits no detectable intensity as measured in counts of a diffraction peak for the amorphous phase as measured by conventional x-ray diffraction (XRD). The term "rutile phase" means the film or coating totally or substantially has a rutile crystal structure (i.e., exhibits a detectable intensity as measured in counts of a diffraction peak for the rutile phase as measured by XRD) and the term "anatase phase" means the film or coating totally or substantially has an anatase crystal structure (i.e., exhibits a detectable intensity as measured in counts of a diffraction peak for the anatase phase as measured by XRD). An additional aspect of the invention is directed to changing the phase of a titanium oxide film, e.g., changing the phase(s) of a sputter deposited film from the amorphous phase to a film that includes the anatase and/or rutile phase(s). This aspect of the invention will be appreciated from the following discussion.

In the following discussion, unless indicated to the contrary, the following conditions apply. The substrates were pieces of 12 inches (30 centimeters ("cm")) square or 6 inches by 12 inches (15 cm by 30 cm) clear glass having a thickness of about 0.088 inch (2.3 millimeters ("mm")) made by the float process. The air side of the glass pieces was coated. The air side of glass made by the float process is the side opposite of the side floating on the molten metal bath as the glass ribbon moves through the forming chamber. Reference may be made to U.S. Pat. Nos. 6,027,766 and 4,091,156 for a discussion of forming a flat glass ribbon. The glass pieces were cut from glass sheets cut from a glass ribbon. As can be appreciated, the composition, type, configuration, and dimensions of the substrates are not limiting to the invention and any type of substrate may be used, e.g., colored glass, plastics, metal, ceramics, and wood to name a few types of materials that may be used. Each of the glass pieces was sputter coated in an Airco ILS 1600 magnetron sputter vacuum coater. As can be appreciated, the invention is not limited to the type of sputtering or the apparatus used. For example, all types of sputter techniques may be used. A titanium metal film was sputter deposited on a glass piece or substrate by energizing a titanium metal target contained in a chamber having a 100% argon gas atmosphere; a zirconium metal film was deposited on a glass piece or substrate by energizing a zirconium metal target contained in a chamber having a 100% argon gas atmosphere. A titanium oxide film was deposited on a glass piece or substrate by energizing a titanium target contained in a chamber having about a 50% oxygen, 50% argon gas atmosphere. The term "titanium oxide" used herein when referring to the anatase phase, rutile phase, and amorphous phase includes a film having titanium dioxide and/or sub-oxides and/or super-oxides of titanium. A zirconium oxide film was deposited on a glass piece or substrate by energizing a zirconium metal target contained in a chamber having about a 50% oxygen, 50% argon gas atmosphere. The percentages of oxygen and argon in the chamber when sputter depositing the titanium oxide and zirconium oxide films was based on the combined flow of oxygen and argon gases into the chamber. A titanium nitride film was deposited on a glass piece or substrate by energizing a titanium metal target contained in a chamber having about a 100% nitrogen gas atmosphere. The operating gas pressure for all atmospheres was 4 microns. Prior to filling the chamber with the desired atmosphere, the chamber was pumped down, i.e., evacuating the atmosphere from the chamber to a value within the range of about 5 to $9 \times 10^{-6}$ Torr.

Table I below shows the power in kilowatts and the number of passes the samples made at a line speed of 120 inches (304.8 cm) per minute. The sputter coated substrates were cut into 4 inch (10.2 cm) square pieces and heated in a furnace. The pieces were moved into the furnace set at a temperature of about 1300° F. (704.4° C.) and heated for a period of about 2½ minutes. The temperature of the furnace was calculated using a piece of uncoated glass sized similar to the coated pieces. The temperature was measured using a thermocouple contacting the surface of the calculation piece; the measured temperature was about 1216° F. (657.8° C.) after about 2 ½ minutes. After heating, the pieces were removed and placed in an oven heated to about 275° F. (135° C.) for about 4 minutes and removed. The pieces were placed in the oven to anneal the glass pieces to prevent fracturing of the glass pieces and for ease of cutting. The crystalline phases of the sputter deposited films of titanium metal, titanium oxide, titanium nitride, and titanium oxynitride, and of zirconium metal and zirconium oxide were measured using x-ray diffraction (XRD). The samples measured were about one inch (2.54 cm) square cut from the 4 inch (10.2 cm) square pieces. The x-ray diffraction analysis was performed using a Philips X-Pert MPD using the grazing angle method and comparing the peaks to standard x-ray diffraction identification cards (PDF cards) commercially available from JCPDS International Center for Diffraction Data. The generated pattern or curve has on the "x" axis 2-Theta (degree) and on the "y" axis intensity in counts. For zirconium oxide in the cubic phase, the (1,1,1) plane has a peak at a 2-Theta of about 30.484 degrees (PDF # 27-0997). While orthorhombic zirconium oxide has a peak at a 2-Theta of 30.537 (PDF #34-1084), it is believed the peaks observed in the present invention were for cubic rather than for orthorhombic zirconium oxide. However, orthorhombic zirconium oxide could be present. Alternatively, in another embodiment the zirconium oxide can be in the baddeleyite structure (PDF #37-1484). For titanium oxide in the rutile phase, the (1,1,0) plane has a peak at a 2-Theta of about 27.446 degrees and for titanium oxide in the anatase phase, the (1,0,1) plane has a peak at a 2-Theta of about 25.281 degrees. Amorphous titanium oxide and amorphous zirconium oxide show no peaks when analyzed using x-ray diffraction. The intensity count for peaks was determined by either using software that is part of the Philips equipment or by estimating the peak height. The peak count indicates the presence of a phase; the higher the count, the more dominant is the presence of the phase. A count was made every 10 seconds or equivalent to a 10 second count. The values presented herein unless indicated otherwise are relative values one to the other because the equipment was not calculated using a standard before the measurements were made. When the peak was estimated, operator judgment is used to determine the count range, more particularly, the operator selects one point on the curve or pattern to be the start point and another point on the curve to be the end point of the peak and interpolates the height from the curve portions between the start and end points. Although operator judgment is involved, the object is to identify the presence of anatase crystalline phase and the relative amount. For purposes of appreciating the invention, the x-ray diffraction technique is acceptable for determining the presence of different phases of zirconium oxide and titanium oxide. Using this technique to determine the presence, type, and intensity of phases present, it must be appreciated that absence of a peak is not an indication that the oxide is amorphous. To determine if any crystals are present a more sensitive technique is required, e.g., electron diffraction.

The area under the curve between the start and end points gives the crystal size for a calibrated instrument. In the present case, the area under the curve gives relative size. The interest in this investigation was to determine the presence of anatase phase and, therefore, the peak height was of major interest. Table I lists the peak height in counts for samples that had their x-ray diffractive patterns analyzed using the software. Peak heights for the other samples were not made using the software but were estimated from an x-ray diffraction curve. The estimate for those samples is given in the discussion of the samples and identified as an estimate by a check "X" on Table I.

Table I lists the target material; the atmosphere (gas) in the chamber during coating; the power in kilowatts; the number of passes; the thickness of the sputter deposited film after coating; the thickness of the sputter deposited metal films after heating; and the height of the peaks in 10 second counts for each of the phases that were identified as being present, when the peak height was determined by an operator the value is given in the discussion of the sample and shown as a check "X" on Table I. The value determined using the software is given in numerical value on Table I. The reported thicknesses of the sputter deposited films (except for samples 19 and 25) and/or coatings were measured by conventional x-ray fluorescence and stylus profilometer measurements. The reported thicknesses for samples 19 and 25 were estimated using curves developed from past coater performance.

When no peaks were observed for the zirconium oxide and titanium oxide films, a check "X" is put in the amorphous column. When reference is made to the presence of peaks, it is the presence of peaks at the 2-Theta angles. Further, the samples were not run in the order presented. The samples are presented to compare like coatings where practical.

Sample 1

A zirconium oxide film having a thickness of about 68 Angstroms was deposited on a glass substrate. The x-ray diffraction pattern of the zirconium oxide film after heating showed the cubic phase. It is estimated that the peak height in counts is in the range of about 250-350 counts.

Sample 2

A zirconium oxide film having a thickness of about 187 Angstroms was deposited on a glass substrate. The x-ray diffraction pattern of the zirconium oxide after heating showed the cubic phase. It is estimated that the peak height in counts is in the range of about 1000-1100 counts.

Sample 3

A zirconium metal film having a thickness of 177 Angstroms was deposited on a glass substrate; the coated glass substrate was heated. The zirconium oxide film formed during heating had a thickness of about 256 Angstroms. The x-ray diffraction pattern of the zirconium oxide film showed the cubic phase. It is estimated that the peak height in counts is in the range of about 250-350 counts. An additional peak was observed at about 28.5 2-Theta degrees. The peak or its cause have not been identified; however, the peak was not present in the x-ray diffraction curve for Sample 2.

Samples 1-3 were made, and the films analyzed to determine if zirconium metal and/or zirconium metal oxide have a peak at the same 2-Theta value as an anatase peak for titanium oxide. The zirconium oxide films did not show any peak at the 2-Theta value.

Sample 4

A titanium oxide film having a thickness of 218 Angstroms was deposited on a glass substrate. After heating, the film was analyzed by x-ray diffraction. No peaks were noted.

Sample 5

A titanium film having a thickness of 109 Angstroms was deposited on a glass substrate and the coated substrate was heated. The film thickness after heating was 207 Angstroms. The titanium oxide film was analyzed by x-ray diffraction. No peaks were observed.

Sample 6

A zirconium oxide film having a thickness of 20 Angstroms was deposited on a glass substrate and a titanium oxide film having a thickness of 220 Angstroms was deposited on the zirconium oxide film. The x-ray diffraction pattern showed no peaks for the zirconium oxide film or the titanium oxide film. No peaks indicated that the zirconium oxide film and the titanium oxide film were amorphous.

Sample 7

Sample 7 was a repeat of Sample 6 and confirmed that neither the zirconium oxide film nor the titanium oxide film had peaks.

Sample 8

A zirconium oxide film having a thickness of 31 Angstroms was deposited on a glass substrate and a titanium oxide film having a thickness of 221 Angstroms was deposited on the zirconium oxide film. After heating, the coated substrate was analyzed by x-ray diffraction. The zirconium oxide film had no peaks to indicate the presence of cubic zirconium. The titanium oxide had the rutile phase with a peak height of about 94 counts. No anatase was observed.

Sample 9

A zirconium oxide film having a thickness of 45 Angstroms was deposited on a glass substrate and a titanium oxide film having a thickness of 215 Angstroms deposited on the zirconium oxide film. After heating, the coated substrate was analyzed by x-ray diffraction. No cubic zirconium oxide peaks were observed. The titanium oxide had a rutile peak height of 171 counts and an anatase peak height of 310 counts.

Sample 10

A zirconium oxide film having a thickness of 45 Angstroms was deposited on a glass substrate and a titanium oxide film having a thickness of 215 Angstroms deposited on the zirconium oxide film. The x-ray diffraction pattern of the heated substrate had no cubic zirconium oxide peaks. The pattern showed a titanium oxide rutile peak having a peak height of 235 counts and an anatase peak height of 475 counts. Samples 9 and 10 are similar and the differences in the value between the peak counts are within the expected variations.

Sample 11

A zirconium oxide film having a thickness of 65 Angstroms was deposited on a glass substrate and a titanium oxide film having a thickness of 215 Angstroms was deposited on the zirconium oxide film. The x-ray diffraction pattern had a measured peak height for cubic zirconium oxide of 283 counts and a measured peak height for the rutile phase of titanium oxide of 158 counts and for the anatase phase of 665 counts.

Sample 12

A zirconium oxide film having a thickness of 91 Angstroms was deposited on a glass substrate and a titanium oxide film having a thickness of 217 Angstroms was deposited on the zirconium oxide film. The x-ray diffraction pattern had a measured peak height for cubic zirconium oxide of 416 counts and a measured peak height for the rutile phase of titanium oxide of 210 counts and a measured peak height for the anatase phase of titanium oxide of 258 counts.

Sample 13

A zirconium oxide film having a thickness of 105 Angstroms was deposited on a glass substrate and a titanium oxide film having a thickness of 221 Angstroms was deposited on the titanium oxide film. The x-ray diffraction pattern had a measured peak height for cubic zirconium oxide of 548 counts, a measured peak height for rutile phase of titanium oxide of 171 counts and a measured peak height for anatase phase of titanium oxide of 62 counts.

Sample 14

A zirconium oxide film having a thickness of 153 Angstroms was deposited on a glass substrate and a titanium oxide film having a thickness of 221 Angstroms was deposited on the zirconium oxide film. The x-ray diffraction pattern had a measured peak height for cubic zirconium oxide of 555 counts and a measured peak height for rutile titanium oxide of 85 counts. No measurable anatase titanium oxide peak was observed.

Sample 15

A zirconium oxide film having a thickness of 190 Angstroms was deposited on a glass substrate and a titanium oxide film having a thickness of 215 Angstroms was deposited on the zirconium oxide film. The x-ray diffractive pattern had a measured peak height for cubic zirconium oxide of 690 counts and a measured peak height for rutile titanium oxide of 19 counts. No measurable anatase titanium oxide peak was observed.

Sample 16

Sample 16 was a repeat of Sample 15. The measured peak height for cubic zirconium oxide peak was 687 counts and the measured peak height for rutile titanium oxide was 206 counts. No anatase titanium oxide peak was observed. Although there is a difference in peak height counts for the rutile titanium oxide in Samples 15 and 16, the interest here is that no anatase peak was observed in Samples 15 and 16.

Sample 17

A zirconium oxide film having a thickness of 184 Angstroms was deposited on a glass substrate and a titanium metal film having a thickness of 106 Angstroms was deposited on the zirconium oxide film. After heating, the titanium oxide film had a thickness of 205 Angstroms. It is expected from the x-ray diffraction pattern that the cubic zirconium oxide will have a peak height between 1000-1100 counts. No peaks for rutile and anatase were observed.

Sample 18

A zirconium metal film having a thickness of 64 Angstroms was deposited on a glass substrate. A titanium oxide film was deposited on the zirconium metal film and had a thickness of 220 Angstroms. After heating, the zirconium oxide had a thickness of 93 Angstroms. The x-ray diffraction pattern had a measured peak height for cubic zirconium oxide of 208 counts, and a measured peak height for rutile phase of titanium oxide of 146 counts. No measurable anatase titanium oxide peak was observed.

Sample 19

A zirconium metal film having a thickness of 148 Angstroms was deposited on a glass substrate. A titanium oxide film having a thickness of 215 Angstroms was deposited on the zirconium metal film. The zirconium oxide film after heating had a thickness of 264 Angstroms. No cubic, zirconium oxide, or rutile or anatase titanium oxide peaks were observed on the x-ray diffraction curve.

Sample 20

A zirconium metal film having a thickness of 87 Angstroms was deposited on a glass substrate. A titanium oxide film having a thickness of 225 Angstroms was deposited on the zirconium metal film. The zirconium oxide film after heating had a thickness of 126 Angstroms. The x-ray diffraction pattern had a measured height for cubic zirconium oxide of 259 counts, a measured peak height for rutile titanium oxide of 146 counts and a measured peak height for anatase oxides of 80 counts.

Sample 21

A zirconium metal film having a thickness of 182 Angstroms was deposited on a glass substrate, and a titanium metal film having a thickness of 113 Angstroms was deposited on the zirconium metal film. After heating, the zirconium oxide film had a thickness of 263 Angstroms, and the titanium oxide film had a thickness of 214 Angstroms. The x-ray diffraction pattern shows no measurable peaks for cubic zirconium oxide and anatase titanium oxide. It is expected from the x-ray diffraction pattern that the rutile titanium oxide will have peak height between 900-1000 counts.

Sample 22

A zirconium metal film having a thickness of 87 Angstroms was deposited on a glass substrate, and a titanium metal film having a thickness of 115 Angstroms was deposited on the zirconium metal film. After heating, the zirconium oxide film had a thickness of 126 Angstroms, and the titanium oxide film had a thickness of 217 Angstroms. The x-ray diffraction pattern had no observable peak for the cubic zirconium oxide, and rutile and anatase titanium oxide.

Sample 23

A titanium oxide film having a thickness of 218 Angstroms was deposited on a glass substrate, and a titanium metal film having a thickness of 110 Angstroms was deposited on the titanium oxide film. After heating, the titanium metal film had a thickness of 208 Angstroms. The x-ray diffraction pattern had no observable peaks for rutile and anatase titanium oxide.

Sample 24

A titanium metal film having a thickness of 58 Angstroms was deposited on a glass substrate; the film after heating, was a titanium oxide film having a thickness of 110 Angstroms. A titanium oxide film having a thickness of 223 Angstroms was deposited on the titanium metal film. The x-ray diffraction pattern had no observable peaks for the rutile and anatase titanium oxide.

Sample 25

A titanium metal film having a thickness of 119 Angstroms was deposited on a glass substrate; the film after heating was a titanium oxide film having a thickness of 249 Angstroms. A titanium oxide film having a thickness of 215 Angstroms was deposited on the titanium metal film. The x-ray diffraction pattern had no measurable peak for rutile and anatase titanium oxide.

Sample 26

A titanium nitride film having a thickness of 216 Angstroms was deposited on a glass substrate. The film thickness after heating was 384 Å. The composition of the film was not analyzed. The film during heating is expected to oxidize but to what extent was not determined; therefore, the film can include titanium nitride, titanium oxynitride or titanium oxide. A titanium film having a thickness of 119 Angstroms was deposited on the titanium nitride film; after heating, the titanium oxide film had a thickness of 223 Angstroms. The x-ray diffraction pattern showed a rutile peak. It is not known if the peak was from the heated titanium rutile film or the heated titanium metal film or combinations thereof. It is expected that the rutile will have a peak height between 100-250 counts. No anatase peaks were observed.

Sample 27

A zirconium oxide film having a thickness of 190 Angstroms was deposited on a glass substrate. A titanium nitride film having an unknown thickness was deposited on the zirconium oxide film. The titanium nitride film after heating had a thickness of 364 Å. See discussion in Sample 26 regarding composition of heated titanium nitride film. It is expected from the x-ray diffraction pattern that the cubic zirconium oxide will have a peak height between 900-1000. The rutile of the heated titanium nitride film will have a peak height between 100-200 counts and the anatase will have a peak height between 250-300 counts.

Sample 28

A 4 inch (10.2 cm) square piece of Sample 2 was heated and a titanium oxide film having a thickness of 220 Angstroms was deposited on the heated coating of Sample 2. The sample was not heated after depositing the titanium oxide film. The peak for cubic zirconium oxide was observed as discussed in Sample 2. No peaks were observed for rutile or anatase titanium oxide.

Sample 29

A 4 inch (10.2 cm) square piece of Sample 1 was heated and a titanium oxide film having a thickness of 220 Angstroms was deposited on the heated coating of Sample 1. After coating, the coated piece was not heated. The peak for cubic zirconium oxide was observed as discussed in Sample 1. No peaks were observed for rutile or anatase titanium oxide.

Sample 30

Sample 30 was a repeat of Sample 28 except after the titanium oxide film was deposited, the coated sample was heated for the second time. The x-ray diffraction pattern had a cubic zirconium oxide peak height of 1036 counts, and a rutile titanium oxide peak height of 167 counts. No anatase peaks were noted.

Sample 31

Sample 31 was a repeat of Sample 29 except after the titanium oxide film was deposited, the coated glass was heated for the second time. The x-ray diffraction pattern had a cubic zirconium oxide peak height of 285 counts and a rutile titanium oxide peak height of 246 counts. No anatase peak was noted.

Sample 32

A zirconium oxide film having a thickness of 173 Angstroms was deposited on a glass substrate. The glass substrate was heated after which a titanium metal film having a thickness of 115 Angstroms was deposited on the heated zirconium oxide coated glass substrate. The coated glass substrate was heated, and the titanium oxide film had a thickness of 217 Angstroms. The x-ray diffraction pattern had a cubic zirconium oxide peak height of 932 counts. No rutile or anatase titanium oxide peaks were observed.

Sample 33

A zirconium oxide film having a thickness of 65 Angstroms was deposited on a glass substrate and a titanium metal having a thickness of 115 Angstroms deposited on the zirconium oxide. The glass substrate was heated. After heating, a titanium oxide film having a thickness of 217 Angstroms was deposited on the heated zirconium oxide coated glass substrate. The x-ray diffraction pattern had a cubic zirconium oxide peak height of 288 counts. No rutile or anatase titanium oxide peaks were noted.

A study of Samples 1-33 shows that the peak height for both the anatase titanium oxide phase and the rutile titanium oxide phase of Samples 6-16 follow an approximate bell-shaped curve (see FIG. 3) when plotted as a function of thickness of the zirconium oxide layer. Table II below shows the peak counts for the cubic zirconium oxide phase and the rutile and anatase titanium oxide phase for Samples 6-16. The first layer for each of the Samples 6-16 is zirconium oxide and the second layer for each of the Samples 6-16 is titanium oxide. It should be noted that the thickness of the titanium oxide layer for Samples 6-16 is the same. This is unexpected because the bell-shaped curve for peak heights is a result of the change in the thickness of the zirconium oxide layer, not the thickness of the titanium oxide layer. Support for this conclusion is the fact that the shape of the increase in peak heights for the zirconium oxide phase is not bell shaped.

TABLE I

| Sample No. | Layers | Target Material | Chamber Atmosphere | Power KW | No. of Passes | Coating Thickness (Angstroms) After Coating | Coating Thickness (Angstroms) After Heating | Amorphous | Peak Count Titanium Oxide Rutile | Peak Count Titanium Oxide Anatase | Zirconium Oxide Cubic |
|---|---|---|---|---|---|---|---|---|---|---|---|
| 1 | 1 | Zr | $O_2$ | 3.7 | 3 | 68 | | | | | X |
| 2 | 1 | Zr | $O_2$ | 5.2 | 6 | 187 | | | | | X |
| 3 | 1 | Zr | Ar | 2.3 | 1 | 177 | 256 | | | | X |
| 4 | 1 | Ti | $O_2$ | 6.0 | 14 | 218 | | X | | | |
| 5 | 1 | Ti | Ar | 2.8 | 1 | 109 | 207 | X | | | |
| 6 | 1 | Zr | $O_2$ | 3.7 | 1 | 20 | | X | | | |
|   | 2 | Ti | $O_2$ | 6 | 14 | 216 | | X | | | |
| 7 | 1 | Zr | $O_2$ | 3.7 | 1 | 20 | | X | | | |
|   | 2 | Ti | $O_2$ | 6 | 14 | 220 | | X | | | |
| 8 | 1 | Zr | $O_2$ | 5.2 | 1 | 31 | | X | | | |
|   | 2 | Ti | $O_2$ | 6 | 14 | 221 | | | 94 | | |
| 9 | 1 | Zr | $O_2$ | 3.7 | 2 | 45 | | X | | | 241 |
|   | 2 | Ti | $O_2$ | 6.0 | 14 | 215 | | | 171 | 310 | |
| 10 | 1 | Zr | $O_2$ | 3.7 | 2 | 45 | | X | | | |
|   | 2 | Ti | $O_2$ | 6 | 14 | 215 | | | 235 | 475 | |
| 11 | 1 | Zr | $O_2$ | 3.7 | 3 | 65 | | | | | 283 |
|   | 2 | Ti | $O_2$ | 6 | 14 | 219 | | | 158 | 665 | |
| 12 | 1 | Zr | $O_2$ | 3.7 | 4 | 91 | | | | | 416 |
|   | 2 | Ti | $O_2$ | 6 | 14 | 217 | | | 210 | 258 | |
| 13 | 1 | Zr | $O_2$ | 3.7 | 5 | 105 | | | | | 548 |
|   | 2 | Ti | $O_2$ | 6 | 14 | 221 | | | 171 | 62 | |
| 14 | 1 | Zr | $O_2$ | 3.7 | 7 | 153 | | | | | 555 |
|   | 2 | Ti | $O_2$ | 6 | 14 | 221 | | | 85 | | |

TABLE I-continued

| Sample No. | Layers | Target Material | Chamber Atmosphere | Power KW | No. of Passes | Coating Thickness (Angstroms) After Coating | Coating Thickness (Angstroms) After Heating | Peak Count Amorphous | Peak Count Titanium Oxide Rutile | Peak Count Titanium Oxide Anatase | Peak Count Zirconium Oxide Cubic |
|---|---|---|---|---|---|---|---|---|---|---|---|
| 15 | 1 | Zr | $O_2$ | 5.2 | 6 | 190 | | | | | 690 |
| | 2 | Ti | $O_2$ | 6 | 14 | 215 | | | 19 | | |
| 16 | 1 | Zr | $O_2$ | 5.2 | 6 | 181 | | | | | 687 |
| | 2 | Ti | $O_2$ | 6.0 | 14 | 223 | | | 206 | | |
| 17 | 1 | Zr | $O_2$ | 5.2 | 6 | 184 | | | | | X |
| | 2 | Ti | Ar | 2.8 | 1 | 106 | 205 | X | | | |
| 18 | 1 | Zr | Ar | 0.5 | 1 | 64 | 93 | | | | 208 |
| | 2 | Ti | $O_2$ | 6 | 14 | 220 | | | 146 | | |
| 19 | 1 | Zr | Ar | 2.3 | 1 | 148 | 264 | X | | | |
| | 2 | Ti | $O_2$ | 6 | 14 | 215 | | X | | | |
| 20 | 1 | Zr | Ar | 0.8 | 1 | 87 | 126 | | | | 259 |
| | 2 | Ti | $O_2$ | 6 | 14 | 225 | | | 146 | 80 | |
| 21 | 1 | Zr | Ar | 2.3 | 1 | 182 | 263 | X | | | |
| | 2 | Ti | Ar | 2.8 | 1 | 113 | 214 | | X | | |
| 22 | 1 | Zr | Ar | 0.8 | 1 | 87 | 126 | X | | | |
| | 2 | Ti | Ar | 2.8 | 1 | 115 | 217 | X | | | |
| 23 | 1 | Ti | $O_2$ | 6.0 | 14 | 218 | | X | | | |
| | 2 | Ti | Ar | 2.8 | 1 | 110 | 208 | X | | | |
| 24 | 1 | Ti | Ar | 1.4 | 1 | 58 | 110 | X | | | |
| | 2 | Ti | $O_2$ | 6.0 | 14 | 223 | | X | | | |
| 25 | 1 | Ti | Ar | 2.8 | 1 | 119 | 249 | X | | | |
| | 2 | Ti | $O_2$ | 6.0 | 14 | 215 | | X | | | |
| 26 | 1 | Ti | $N_2$ | 4.4 | 5 | UK | 384 | | X | | |
| | 2 | Ti | Ar | 2.8 | 1 | UK | 223 | | X | | |
| 27 | 1 | Zr | $O_2$ | 5.2 | 6 | 190 | | | | | X |
| | 2 | Ti | $N_2$ | 4.4 | 5 | UK | 364 | | X | X | |
| 28 | 1 | Sample 2 heated | | | | | | | | | X |
| | 2 | Ti | $O_2$ | 6 | 14 | 220 | | X | | | |
| 29 | 1 | Sample 1 heated | | | | | | | | | X |
| | 2 | Ti | $O_2$ | 6 | 14 | 220 | | X | | | |
| 30 | 1 | Replicate Sample 2 heated | | | | | | | | | 1036 |
| | 2 | Ti | $O_2$ | 6 | 14 | 220 | | | 167 | | |
| 31 | 1 | Replicate Sample 1 heated | | | | | | | | | 285 |
| | 2 | Ti | $O_2$ | 6 | 14 | 220 | | | 246 | | |
| 32 | 1 | Zr | $O_2$ | 5.2 | 6 | 173 | | | | | 932 |
| | 2 | Ti | Ar | 2.8 | 1 | 115 | 217 | X | | | |
| 33 | 1 | Zr | $O_2$ | 3.7 | 3 | 65 | | | | | 288 |
| | 2 | Ti | Ar | 2.8 | 1 | 115 | 217 | X | | | |

TABLE II

| Sample No. | Thickness Angstroms Layer 1 | Thickness Angstroms Layer 2 | Counts Rutile | Counts Anatase | Counts Cubic |
|---|---|---|---|---|---|
| 6 | 20 | 216 | 0 | 0 | 0 |
| 7 | 20 | 220 | 0 | 0 | 0 |
| 8 | 31 | 221 | 94 | 0 | 0 |
| 9 | 45 | 215 | 171 | 310 | 0 |
| 10 | 45 | 215 | 235 | 475 | 0 |
| 11 | 65 | 219 | 158 | 665 | 283 |
| 12 | 91 | 217 | 210 | 258 | 416 |
| 13 | 105 | 221 | 171 | 62 | 548 |
| 14 | 153 | 221 | 85 | 0 | 555 |
| 15 | 190 | 215 | 19 | 0 | 690 |
| 16 | 181 | 223 | 206 | 0 | 687 |

It should be further noted that the value for Sample 16 was not plotted in the curves shown in FIG. 3 because the peak count for the titanium oxide phase rutile was exceptionally greater than the peak height for the rutile titanium oxide phase of Sample 15 and did not follow the bell-shape pattern. The curves of FIG. 3 and the data of Table II show an increase of peak counts for the anatase titanium oxide phase at a zirconium oxide thickness of about 65-75 Angstroms and thereafter the counts for peak height of the anatase titanium oxide phase decreases. The rutile titanium oxide phase has an increase in counts for peak height at zirconium oxide up to a thickness in the range of about 51-102 Angstroms, and thereafter the counts for peak height decreases.

In the following Samples 34-37, the deposition parameters were controlled to try to deposit coatings having a thickness each of the zirconium oxide layer of about 65-75 Angstroms which appeared to provide the maximum peak height count for anatase titanium oxide phase (see Table II). The deposition parameters for Samples 34-45 are shown in Table III below. In the following Sample 38, the titanium oxide layer thickness was similar to the titanium oxide thickness of Samples 34-37 with the zirconium oxide layer thickness increased. In the following Samples 39-43, the thickness of the zirconium oxide layer and the first layer of the titanium oxide were kept constant and the thickness of the second layer of titanium oxide varied. In the following Samples 44 and 45, the thickness of the zirconium oxide and titanium oxide layers was varied. Samples 38-45 were coated as discussed above except that Samples 34-45 were heated and after heating the samples were removed from the furnace and allowed to cool to room temperature instead of being placed in an oven.

Sample 34

A zirconium oxide film having a thickness of 71 Angstroms was deposited on a glass substrate after which a titanium oxide film having a thickness of 130 Angstroms was deposited on the zirconium oxide film. The x-ray diffraction pattern had a measured peak height for cubic zirconium oxide phase of 241 counts and for rutile titanium oxide phase of 164 counts. No anatase titanium oxide peak was observed.

Sample 35

A zirconium oxide film having a thickness of 65 Angstroms was deposited on a glass substrate after which a titanium oxide film having a film thickness of 65 Angstroms was deposited on the zirconium oxide film. The x-ray diffraction pattern had a measured peak height for cubic zirconium oxide phase of 267 counts. No rutile or anatase titanium oxide phase peaks were noted.

(Note: for Samples 36 and 37 the counts for peak heights were made using an x-ray tube different than the x-ray tube used for the samples. The counts for peaks are significantly higher and should be taken into account when comparisons are made.)

Sample 36

A zirconium oxide film having a thickness of 65 Angstroms was deposited on a glass substrate after which a titanium oxide film having a thickness of 177 Angstroms was deposited on the zirconium oxide film. The x-ray diffraction pattern had a measured peak height for cubic zirconium oxide phase of 1136 and for rutile titanium oxide phase of 1169. A trace of the anatase titanium oxide peak was observed.

Sample 37

A zirconium oxide film having a thickness of 62 Angstroms was deposited on a glass substrate after which a titanium oxide film having a thickness of 192 Angstroms was deposited on the zirconium oxide film. The x-ray diffraction pattern had a measured peak height for cubic zirconium oxide phase of 1315, for rutile titanium oxide phase of 845, and for anatase titanium oxide phase of 2284.

Sample 38

A zirconium oxide film having a thickness of 173 Angstroms was deposited on a glass substrate. A titanium oxide film having a thickness of 114 Angstroms was deposited on the zirconium oxide film. An x-ray diffraction pattern was made; however, peak heights were not estimated or calculated. From the x-ray diffraction pattern, a peak for cubic zirconium oxide phase and what appears to be a displaced peak for rutile titanium oxide phase were observed. The zirconium oxide phase was more noticeable than the rutile titanium oxide phase. No peak was observed for the anatase titanium oxide phase.

Sample 39

Sample 39 is similar to Sample 34 except prior to heating the coated substrate having zirconium oxide and titanium oxide film, an additional titanium metal film having a thickness of 48 Angstroms was deposited on the titanium oxide film. The coated substrate was heated and the heated titanium metal film oxidized and the resulting titanium oxide film had a thickness of 90 Angstroms. The x-ray diffraction pattern showed a cubic zirconium oxide phase having a peak count of 240, a rutile titanium oxide phase having a peak count of 178, and an anatase titanium oxide phase having a peak count of 187 counts.

Sample 40

Sample 40 is similar to Sample 35 except a titanium metal film having a thickness of 80 Angstroms was deposited on the titanium oxide film. The coated substrate was heated and the heated titanium metal film oxidized and the resulting titanium oxide film had a thickness of 151 Angstroms. The x-ray diffraction pattern had a cubic zirconium oxide phase peak count of 241. No rutile or anatase titanium oxide peaks were observed.

Sample 41

Sample 41 is similar to Sample 35 except a titanium metal having a thickness of 25 Angstroms was deposited on the titanium oxide film. The coated substrate was heated and the heated titanium metal film oxidized and the resulting titanium oxide film had a thickness of 47 Angstroms. An x-ray diffraction pattern was made; however, peak heights were not estimated or made. From the x-ray diffraction pattern a peak was observed for the cubic zirconium oxide phase; no peaks were observed for the rutile and anatase titanium oxide phases.

Sample 42

A zirconium oxide film having a thickness of 62 Angstroms was deposited on a glass substrate, a titanium oxide film having a thickness of 98 Angstroms was deposited on the zirconium oxide, and a titanium metal film having a thickness of 46 Angstroms was deposited on the titanium oxide film. The coated substrate was heated and the thickness of the titanium oxide from oxidizing the titanium metal was calculated to be 87 Angstroms. An x-ray diffraction pattern was made; however, peak heights were not estimated or calculated. From the x-ray diffraction pattern a peak was observed for the zirconium oxide phase and for the rutile titanium oxide phase. No peak or a slight trace was observed for the anatase titanium oxide phase.

Sample 43

Sample 43 is similar to Sample 42 except a titanium metal having a thickness of 61 Angstroms was deposited on the titanium oxide film. The calculated thickness of the titanium oxide film from oxidizing the titanium metal film was 116 Angstroms. An x-ray diffraction pattern was made; however, peak heights were not estimated or calculated. From the x-ray diffraction pattern a peak was observed for the zirconium oxide phase and the rutile titanium oxide phase. No peak was observed for the anatase titanium oxide phase.

Sample 44

A zirconium oxide film having a thickness of 57 Angstroms was deposited on a glass substrate; a titanium metal having a thickness of 25 Angstroms was deposited on the zirconium oxide, and a titanium oxide film having a thickness of 65 Angstroms was deposited on the titanium metal. The coated glass was heated in air and the calculated thickness of titanium oxide film from oxidizing the titanium metal film was 47 Angstroms. An x-ray diffraction pattern was made; however, peak heights were not estimated or made. From the x-ray diffraction pattern a peak was observed for the cubic zirconium oxide phase. No peaks were observed for the rutile and anatase titanium oxide phases.

Sample 45

Sample 45 is similar to Sample 38 except a titanium metal having a thickness of 48 Angstroms was deposited on the titanium oxide film. The titanium oxide film after heating the titanium metal film had a calculated thickness of 91 Angstroms. An x-ray diffraction pattern was made; however, peak heights were not measured or calculated. From the x-ray diffraction pattern a peak was observed for cubic zirconium oxide and what appears to be a displaced peak for rutile titanium oxide phase. No peak for anatase titanium oxide phase was observed.

From the results of Samples 34-37, it is observed that anatase titanium oxide phase was developed in titanium oxide films having a thickness of about 169 Angstroms. As can be appreciated, the thickness at which anatase titanium oxide can be developed may be lower. Sample 38 supports the conclusion from Table II that a thick zirconium oxide first layer is not efficient to the development of anatase titanium oxide phase for the titanium dioxide phase in this thickness range of the curve of FIG. 3. This could be dependent upon the thickness of the titanium dioxide film. From the results of Samples 37-45, it is concluded that an anatase titanium oxide phase can be developed from a titanium metal film (see Sample 39). However if the zirconium oxide film is increased, the efficiency for developing an anatase titanium oxide phase appears to significantly decrease (see Sample 45):

The invention may be practiced to provide a self-cleaning film of anatase and/or rutile titanium oxide for residential and commercial windows, for automotive transparencies e.g. side lites, rear windows, windshields, roof windows, oven doors, mirrors, etc.

TABLE III

| Sample No. | Layers | Target Material | Chamber Atmosphere | Power KW | No. of Passes | Coating Thickness After Coating | Coating Thickness After Heating | Peak Count Amorphous | Peak Count Titanium Oxide Rutile | Peak Count Titanium Oxide Anatase | Zirconium Oxide Cubic |
|---|---|---|---|---|---|---|---|---|---|---|---|
| 34 | 1 | Zr | $O_2$ | 3.7 | 3 | 71 | | | | | 241 |
| | 2 | Ti | $O_2$ | 6.0 | 8 | 130 | | | 164 | | |
| 35 | 1 | Zr | $O_2$ | 3.7 | 3 | 65 | | | | | 267 |
| | 2 | Ti | $O_2$ | 6.0 | 4 | 65 | | X | | | |
| 36 | 1 | Zr | $O_2$ | 3.7 | 3 | 65 | | | | | 1136* |
| | 2 | Ti | $O_2$ | 6.0 | 11 | 177 | | | 1169* | | |
| 37 | 1 | Zr | $O_2$ | 3.7 | 3 | 62 | | | | | 1315* |
| | 2 | Ti | $O_2$ | 6.2 | 12 | 192 | | | 845* | 2284* | |
| 38 | 1 | Zr | $O_2$ | 5.2 | 6 | 173 | | | | | X |
| | 2 | Ti | $O_2$ | 6.0 | 8 | 114 | | | X | | |
| 39 | 1 | Zr | $O_2$ | 3.7 | 3 | 68 | | | | | 240 |
| | 2 | Ti | $O_2$ | 6.0 | 8 | 130 | | | | | |
| | 3 | Ti | Ar | 1.2 | 1 | 48 | 90 | | 178 | 187 | |
| 40 | 1 | Zr | $O_2$ | 3.7 | 3 | 68 | | | | | 241 |
| | 2 | Ti | $O_2$ | 6.0 | 4 | 65 | | | | | |
| | 3 | Ti | Ar | 2.0 | 1 | 80 | 151 | X | | | |
| 41 | 1 | Zr | $O_2$ | 3.7 | 3 | 62 | | | | | X |
| | 2 | Ti | $O_2$ | 6.0 | 4 | 65 | | | | | |
| | 3 | Ti | Ar | 0.8 | 1 | 25 | 47 | X | | | |
| 42 | 1 | Zr | $O_2$ | 3.7 | 3 | 62 | | | | | X |
| | 2 | Ti | $O_2$ | 6.0 | 6 | 98 | | | | | |
| | 3 | Ti | Ar | 1.2 | 1 | 46 | 87 | | X | | |
| 43 | 1 | Zr | $O_2$ | 3.7 | 3 | 62 | | | | | X |
| | 2 | Ti | $O_2$ | 6.0 | 6 | 98 | | | | | |
| | 3 | Ti | Ar | 1.6 | 1 | 61 | 116 | | X | | |
| 44 | 1 | Zr | $O_2$ | 3.7 | 3 | 57 | | | | | X |
| | 2 | Ti | Ar | 0.8 | 1 | 25 | 47 | | | | |
| | 3 | Ti | $O_2$ | 6.0 | 4 | 65 | | X | | | |
| 45 | 1 | Zr | $O_2$ | 5.2 | 6 | 184 | | | | | X |
| | 2 | Ti | $O_2$ | 6.0 | 8 | 130 | | | | | |
| | 3 | Ti | Ar | 1.2 | 1 | 48 | 91 | | X | | |

*x-ray tube changed

Additional glass substrates were coated with titanium oxide, zirconium oxide, and coatings of the invention having a titanium oxide coating deposited over zirconium oxide (Samples 54-68 shown in Table IV). The deposition parameters and intensity measurements for these Samples 54-68 are shown in Table IV.

Samples 54-57 show the influence of zirconium oxide layer thickness on the anatase peak for the titanium oxide layer. The behavior is similar to that of the samples discussed above and shown in FIG. 3. However, Samples 54-57 were post-heated at temperatures lower than those of the above Samples 1-45.

Samples 58-62 show the influence of zirconium oxide layer thickness (70 Å-166 Å) with titanium oxide layer thickness (382 Å-441 Å). The thicker zirconium oxide layer does not decrease the intensity of the anatase peak (1,0,1) intensity.

Samples 63 and 64 are comparative examples of titanium dioxide. Compared to Samples 58-62, the Samples 58-62 of the invention show a notably higher anatase peak (1,0,1) intensity.

Samples 65-68 are zirconium oxide coatings and show the peak intensity of zirconium oxide in the cubic phase (1,1,1), they clearly show a distinction between the peak positions for the anatase, rutile, and cubic phases for thin films.

Table IV also shows the presence of rutile, although of significantly lower intensity.

TABLE IV

| Sample No. | Layers | Target Material | Gas (%) Ar | Gas (%) O2 | Power KW | No. of Passes | Thickness (Å) | Preheat Temp (°F.) | XRD Intensity (Counts) TiO2 Anatase (1, 0, 1) Postheat Temp (°C.) 382 | 524 | 598 | 636 |
|---|---|---|---|---|---|---|---|---|---|---|---|---|
| 54 | 1 | Zr | 50 | 50 | 3.7 | 2 | 48 | Room | 110 | 333 | 360 | 317 |
|  | 2 | Ti | 50 | 50 | 5.9 | 11 | 183 |  |  |  |  |  |
| 55 | 1 | Zr | 50 | 50 | 3.7 | 4 | 93 | Room | 0 | 42 | 64 | 64 |
|  | 2 | Ti | 50 | 50 | 5.9 | 11 | 183 |  |  |  |  |  |
| 56 | 1 | Zr | 80 | 20 | 3.2 | 3 | 70 | Room | 194 | 286 | 264 | 279 |
|  | 2 | Ti | 50 | 50 | 5.9 | 11 | 186 |  |  |  |  |  |
| 57 | 1 | Zr | 80 | 20 | 3.6 | 6 | 158 | Room | 0 | 0 | 0 | 0 |
|  | 2 | Ti | 50 | 50 | 5.9 | 11 | 185 |  |  |  |  |  |
| 58 | 1 | Zr | 50 | 50 | 3.7 | 3 | 70 | Room | 258 | 500 | 524 | 453 |
|  | 2 | Ti | 80 | 20 | 5.9 | 11 | 382 |  |  |  |  |  |
| 59 | 1 | Zr | 50 | 50 | 3.7 | 6 | 127 | Room | 387 | 387 | 561 | 491 |
|  | 2 | Ti | 80 | 20 | 5.9 | 11 | 391 |  |  |  |  |  |
| 60 | 1 | Zr | 50 | 50 | 3.7 | 6 | 132 | Room | 65 | 507 | 648 | 552 |
|  | 2 | Ti | 80 | 20 | 5.9 | 11 | 427 |  |  |  |  |  |
| 61 | 1 | Zr | 80 | 20 | 3.2 | 3 | 65 | Room | 120 | 584 | 592 | 598 |
|  | 2 | Ti | 80 | 20 | 5.9 | 11 | 399 |  |  |  |  |  |
| 62 | 1 | Zr | 80 | 20 | 3.7 | 6 | 166 | Room | 261 | 532 | 554 | 554 |
|  | 2 | Ti | 80 | 20 | 5.9 | 11 | 441 |  |  |  |  |  |
| 63 | 1 | Ti | 80 | 20 | 5.9 | 11 | 347 | Room | 0 | 83 | 159 | 82 |
| 64 | 1 | Ti | 80 | 20 | 5.9 | 11 | 392 | Room | 0 | 59 | 67 | 92 |
| 65 | 1 | Zr | 80 | 20 | 3.7 | 6 | 144 | Room | 0 | 0 | 0 | 0 |
| 66 | 1 | Zr | 50 | 50 | 3.7 | 6 | 135 | Room | 0 | 0 | 0 | 0 |
| 67 | 1 | Zr | 80 | 20 | 3.7 | 3 | 82 | Room | 0 | 0 | 0 | 0 |
| 68 | 1 | Zr | 50 | 50 | 3.7 | 3 | 73 | Room | 0 | 0 | 0 | 0 |

| Sample No. | XRD Intensity (Counts) TiO2 Rutile (1, 1, 0) Postheat Temp (°C.) 382 | 524 | 598 | 636 | ZrO2 Cubic (1, 1, 1) Postheat Temp (°C.) 382 | 524 | 598 | 636 | Noise |
|---|---|---|---|---|---|---|---|---|---|
| 54 | 0 | 0 | 0 | 0 | 0 | 0 | 0 |  | 26 |
| 55 | 0 | 42 | 56 | 64 | 0 | 148 | 158 | 171 | 30 |
| 56 | 0 | 0 | 0 | 0 | 0 | 65 | 94 | 112 | 30 |
| 57 | 0 | 38 | 38 | 38 | 54 | 371 | 412 | 388 | 31 |
| 58 | 28 | 40 | 62 | 83 | 0 | 40 | 83 | 95 | 31 |
| 59 | 0 | 40 | 44 | 60 | 0 | 157 | 72 | 157 | 32 |
| 60 | 0 | 49 | 49 | 49 | 0 | 184 | 213 | 223 | 36 |
| 61 | 0 | 0 | 0 | 0 | 0 | 0 | 73 | 73 | 30 |
| 62 | 0 | 0 | 0 | 0 | 0 | 336 | 358 | 379 | 36 |
| 63 | 0 | 0 | 0 | 0 | 0 | 0 | 0 | 0 | 30 |
| 64 | 0 | 0 | 0 | 0 | 0 | 0 | 0 | 0 | 34 |
| 65 | 0 | 0 | 0 | 0 | 52 | 418 | 469 | 435 | 23 |
| 66 | 0 | 0 | 0 | 0 | 0 | 289 | 291 | 333 | 26 |
| 67 | 0 | 0 | 0 | 0 | 0 | 162 | 177 | 177 | 21 |
| 68 | 0 | 0 | 0 | 0 | 0 | 81 | 81 | 95 | 26 |

FEATURE 2 (Hydrophilicity)

Coatings of the invention were compared to conventional titanium dioxide coatings under various conditions to determine the impact of the invention on coating hydrophilicity.

Clear glass substrates having a thickness of 2.3 nm were coated using a commercially available Airco ILS 1600 magnetron sputter vacuum coater. Samples 46-49 were coated only with a titania coating as comparative samples. Samples 50-53 were coated with a coating of the invention having a zirconium oxide film (first film) deposited on the glass substrate and a titanium dioxide film (second film) deposited on the zirconium oxide film. The deposition parameters for Samples 46-53 are shown in Table V below. As shown in Table V, the substrates of Samples 48, 49, 52, and 53 were preheated in a furnace external to the vacuum coater such that the substrates had a temperature of about 370° F. (188° C.) at the beginning of the coating operation. The substrates were not further heated during the coating process. After coating, the samples were evaluated at room temperature of 70° F. (21° C.) and were post-heated to temperatures of 470° F. (243° C.), 579° F. (304° C.), and 686° F. (363° C.) to evaluate the affect of post-coating heat treatment on the hydrophilicity of the coatings.

The phase peak counts were also measured as described above under Feature 1. It should be noted that the phase peak counts herein can be directly compared within a given Table but caution is advised when comparing counts from different Tables because no attempt was made to standardize measurements for different sets of samples. It should be noted that the post-heat temperatures of Samples 46-53 were much lower than for the samples discussed under Feature 1 and that Samples 48, 49, 52, and 53 were preheated. The Samples 46 and 47 (titanium oxide, no preheat) were amorphous. Whereas preheating the substrate showed an XRD intensity for anatase (1,0,1) peak at the highest preheat temperatures (363° C.) for Samples 48 and 49. The coatings with zirconium oxide first layer and no preheat (Samples 50 and 51) showed anatase (1,0,1) peak at 363° C. (Sample 50) and 304° C. (Sample 51), which are lower temperatures than for the samples described in Feature 1. No other peak intensities were present in Samples 48-51 at these temperatures. This indicates that the zirconium oxide first layer influenced the presence of the anatase.

Surprisingly, for the titanium oxide with zirconium oxide first layer that were preheated to 370° F. (188° C.), Sample 52 shows the coating to be amorphous and Sample 53 appears to have small rutile and anatase peaks. Most notably, the peaks are present at about an equal intensity over the range from room temperature to 363° C. Also, for Sample 53, the rutile peak intensity appears to be shifted to a higher 2-Theta value.

TABLE V

| Sample No. | Layers | Target Material | Gas (%) Ar | Gas (%) O2 | Power KW | No. of Passes | Thickness (Å) | Preheat Temp (° C.) | XRD Intensity (Counts) TiO2 Anatase (1, 0, 1) Postheat Temp (° C.) 21 | 243 | 304 | 363 |
|---|---|---|---|---|---|---|---|---|---|---|---|---|
| 46 | 1 | Ti | 50 | 50 | 5.9 | 11 | 173 | 21 | 0 | 0 | 0 | 0 |
| 47 | 1 | Ti | 80 | 20 | 5.9 | 11 | 397 | 21 | 0 | 0 | 0 | 0 |
| 48 | 1 | Ti | 50 | 50 | 5.9 | 11 | 175 | 188 | 0 | 0 | 0 | 124 |
| 49 | 1 | Ti | 80 | 20 | 5.9 | 11 | 447 | 188 | 0 | 0 | 0 | 417 |
| 50 | 1 | Zr | 80 | 20 | 3.2 | 3 | 73 | 21 | 0 | 0 | 0 | 237 |
|  | 2 | Ti | 50 | 50 | 5.9 | 11 | 164 |  |  |  |  |  |
| 51 | 1 | Zr | 80 | 20 | 3.7 | 6 | 155 | 21 | 0 | 0 | 254 | 363 |
|  | 2 | Ti | 80 | 20 | 5.9 | 11 | 287 |  |  |  |  |  |
| 52 | 1 | Zr | 80 | 20 | 3.2 | 3 | 59 | 188 | 0 | 0 | 0 | 0 |
|  | 2 | Ti | 50 | 50 | 5.9 | 11 | 170 |  |  |  |  |  |
| 53 | 1 | Zr | 80 | 20 | 3.7 | 6 | 138 | 188 | 23 | — | — | 25 |
|  | 2 | Ti | 80 | 20 | 5.9 | 11 | 306 |  |  |  |  |  |

| Sample No. | XRD Intensity (Counts) TiO2 Rutile (1, 1, 0) Postheat Temp (° C.) 21 | 243 | 304 | 363 | ZrO2 Cubic (1, 1, 1) Postheat Temp (° C.) 21 | 243 | 304 | 363 |
|---|---|---|---|---|---|---|---|---|
| 46 | 0 | 0 | 0 | 0 | 0 | 0 | 0 | 0 |
| 47 | 0 | 0 | 0 | 0 | 0 | 0 | 0 | 0 |
| 48 | 0 | 0 | 0 | 0 | 0 | 0 | 0 | 0 |
| 49 | 0 | 0 | 0 | 0 | 0 | 0 | 0 | 0 |
| 50 | 0 | 0 | 0 | 0 | 0 | 0 | 0 | 0 |
| 51 | 0 | 0 | 0 | 0 | 0 | 0 | 0 | 0 |
| 52 | 0 | 0 | 0 | 0 | 0 | 0 | 0 | 0 |
| 53 | 66 | — | — | 58 | 0 | 0 | 0 | 0 |

The coated substrates were exposed to UV radiation from a UVA-340 light source at an intensity of 24 W/m$^2$ at the coating surface and the contact angle of a water droplet on the coating measured over time. The results of this procedure for Samples 46-53 are shown in FIGS. 4-11, respectively. The numbers in the figure legends indicate the temperatures (° F.) of post-heating as described above.

From FIGS. 4-11, it can be seen that for a zirconium oxide (73 Å)/titanium oxide (164 Å) coating (Sample 50) with no pre-heating (FIG. 8), the coating of the invention significantly reduces the contact angle of water for post-heating greater than 470° F. (243° C.) compared to a titania (173 Å) coating (Sample 46) alone (FIG. 4). For a similar coating of the invention (Sample 52) with pre-heating to 370° F. (188° C.), the contact angle compared to a similarly preheated titania coating alone (Sample 48) is lower even with no post-heating (compare FIGS. 10 and 6).

Figure 9:
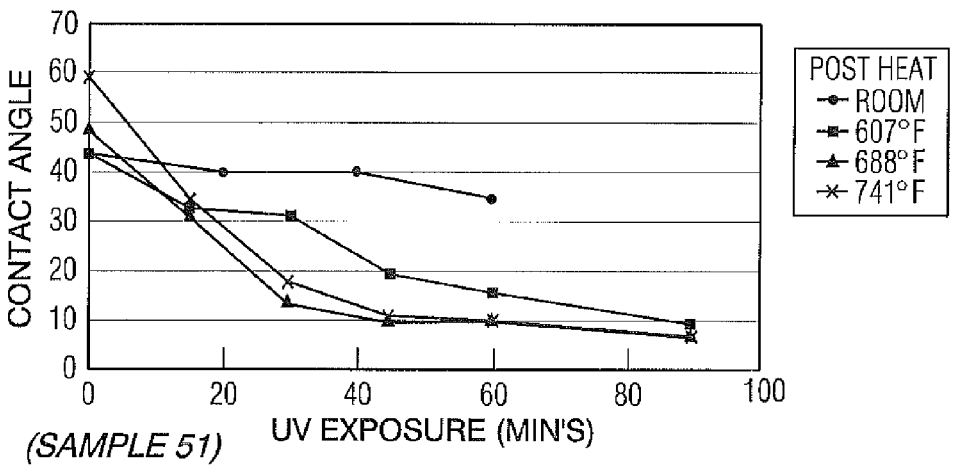
Figure 10:
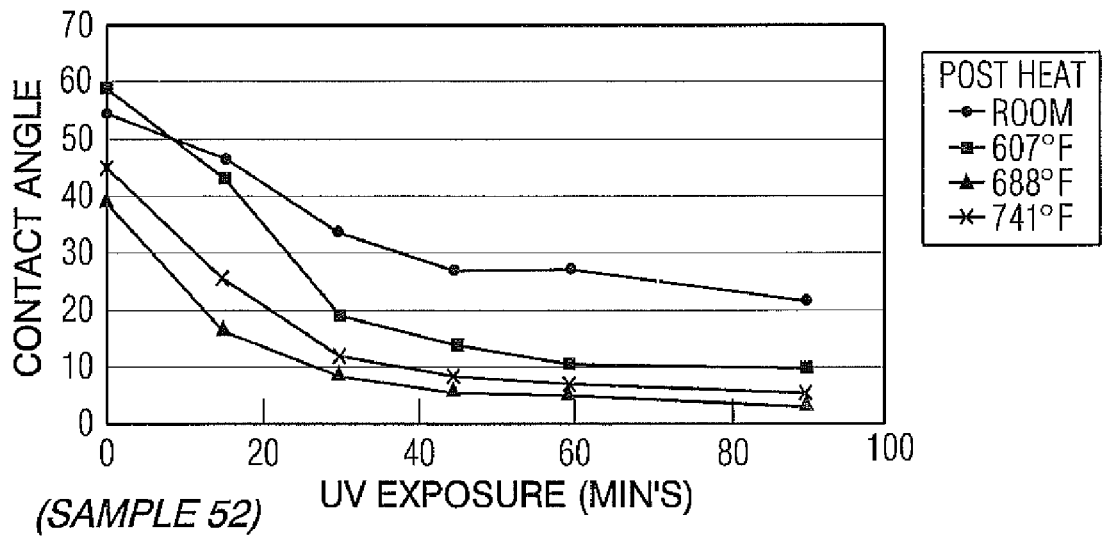
Figure 11:
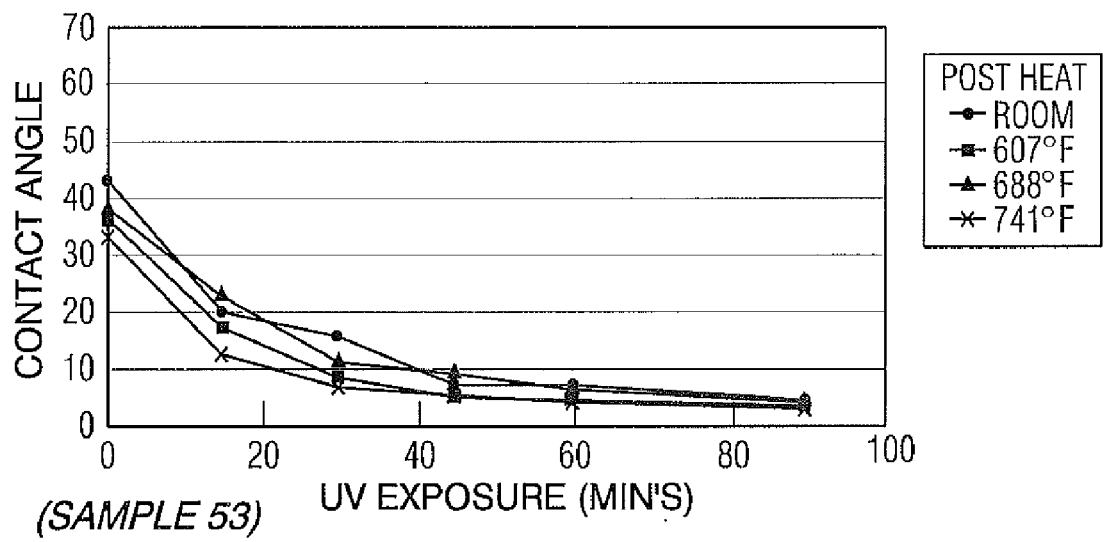

As shown in FIG. 9, for a zirconium oxide (155 Å)/titania (287 Å) coating (Sample 51) with no preheating, the coating shows a lower contact angle than with a titanium dioxide (397 Å) coating (Sample 47) alone (FIG. 5) and the contact angle continues to decrease with post-heating. For a similar coating (Sample 53) with preheating to 370° F. (188° C.), the coating of the invention shows good hydrophilicity even with no post-heating. By not requiring post-heating to achieve hydrophilicity or super-hydrophilicity (i.e., contact angle less than or equal to 5°), significant time and energy savings can be achieved by practicing the method of the invention.

Figure 12:
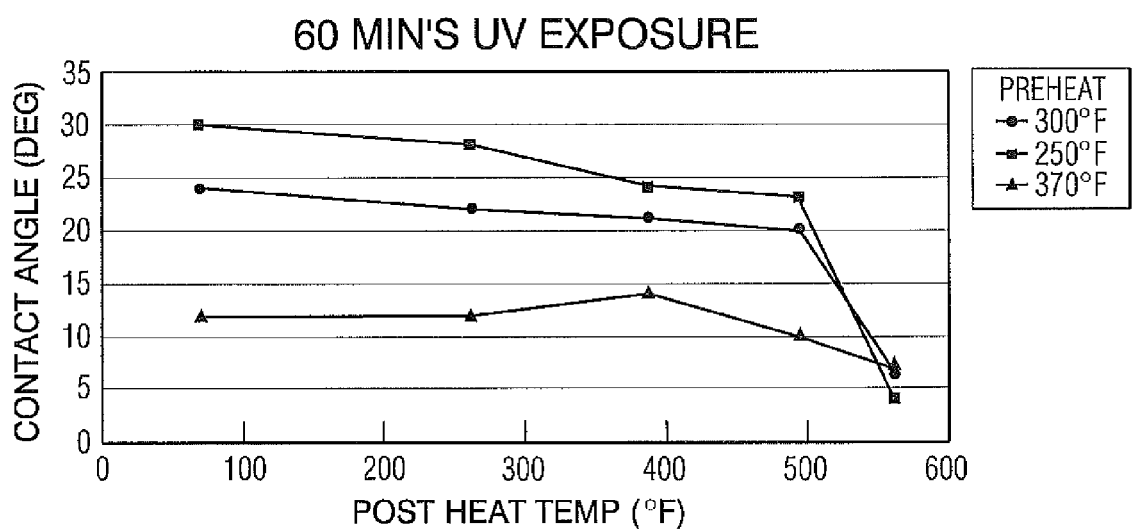
FIG. 12 is a graph showing contact angle versus post-heat temperature for a coating similar to that of FIG. 10.
Figure 13:
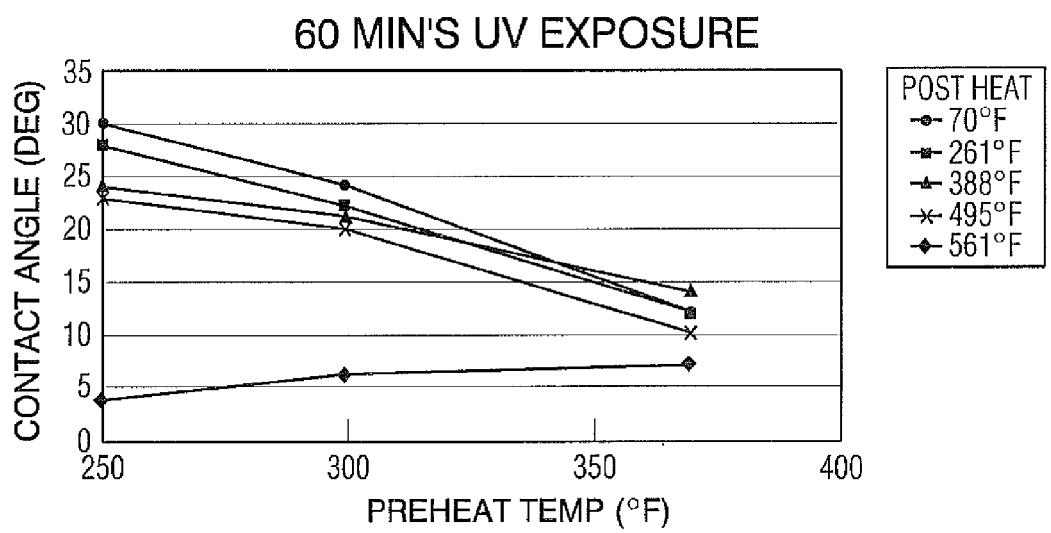
FIG. 13 is a graph showing contact angle versus preheat temperature for a coating similar to that of FIG. 10.

FIGS. 12 and 13 illustrate the effects of preheat and post-heat temperature for a replicate coating to that of Sample 52. FIG. 12 is a graph of contact angle for 60 minutes of UV exposure (340 nm having an intensity of 24 W/m$^2$ at the coating surface) versus post-heat temperature for substrates preheated to 250° F. (121° C.), 300° F. (149° C.), and 370° F. (188° C.). From FIG. 12, it is seen that as the preheat temperature increases, the contact angle decreases. It appears that preheating has a larger affect on the resultant contact angle than post-heating for post-heat temperatures up to about 500° F. (260° C.). FIG. 13 shows that for post-heat temperatures of 261° F. (127° C.), 388° F. (198° C.), and 495° F. (257° C.), preheating the substrate appears to have a larger impact on contact angle than post-heating.

FEATURE 3 (Chemical Durability)

Figure 14:
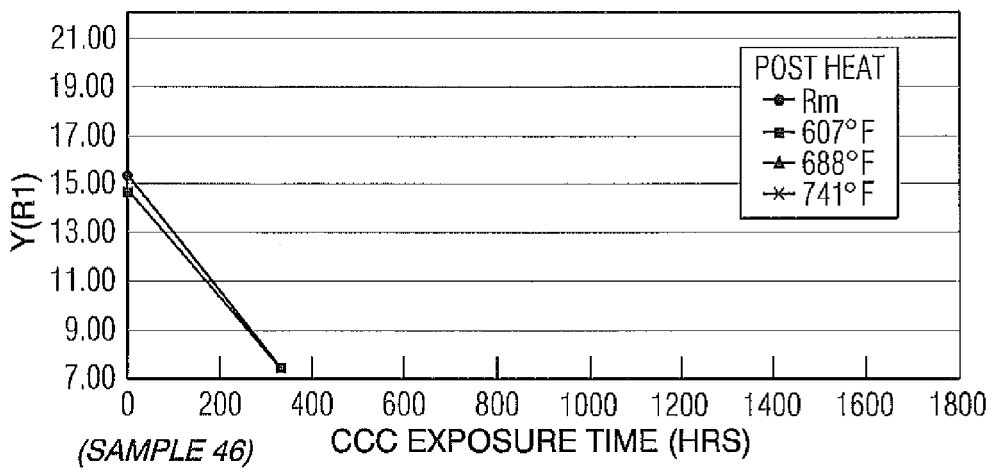
FIGS. 14-21 are graphs showing the results of Cleveland Condensation Tests of coatings similar to those of FIGS. 4-11, respectively.
Figure 15:
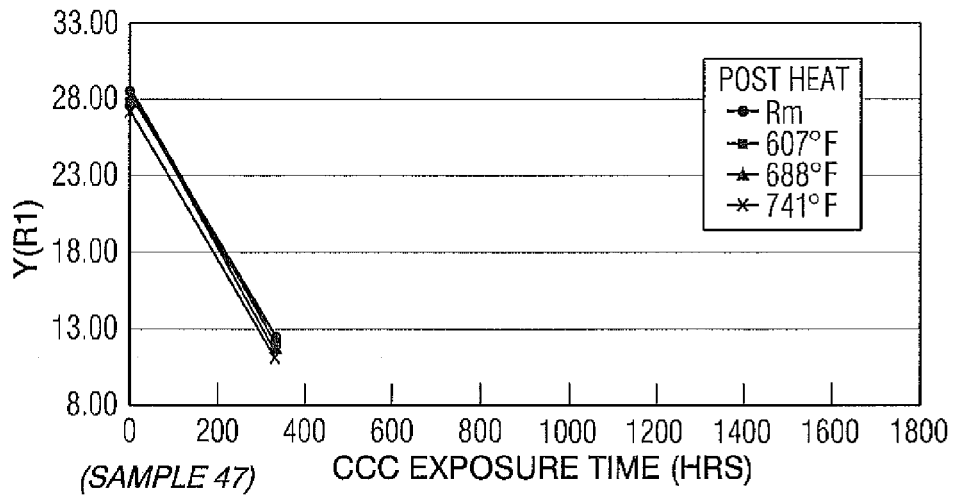
Figure 16:
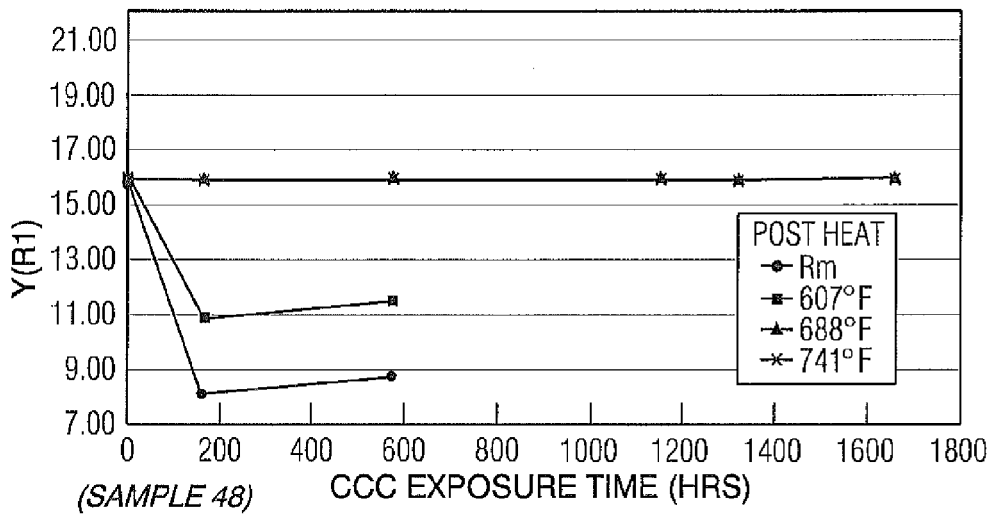
Figure 17:
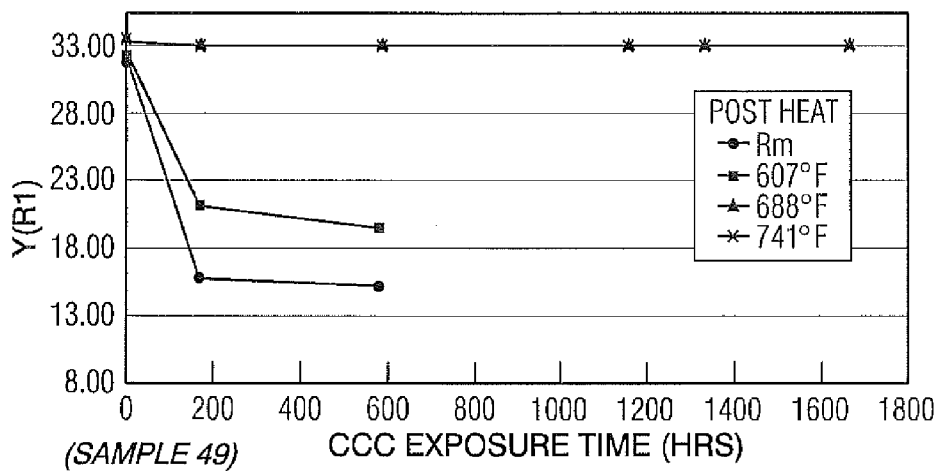
Figure 18:
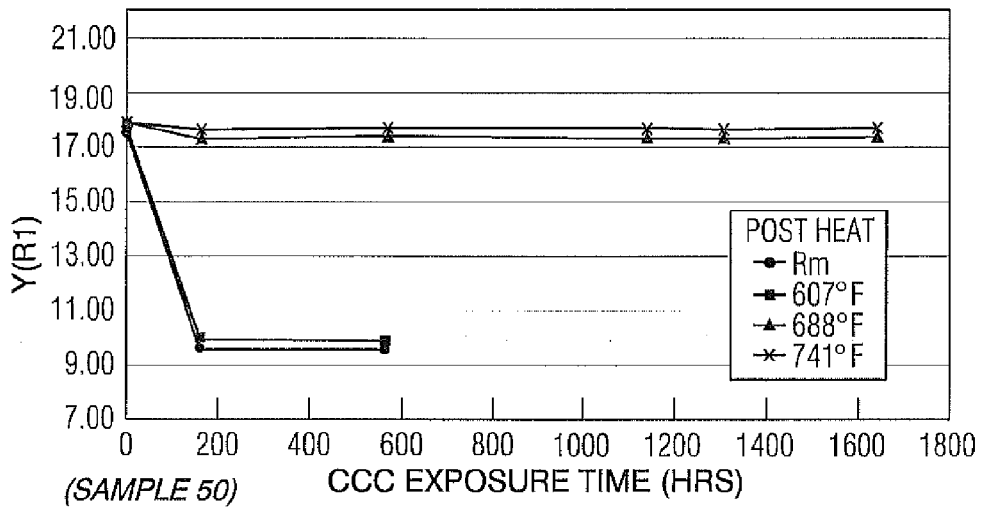
Figure 19:
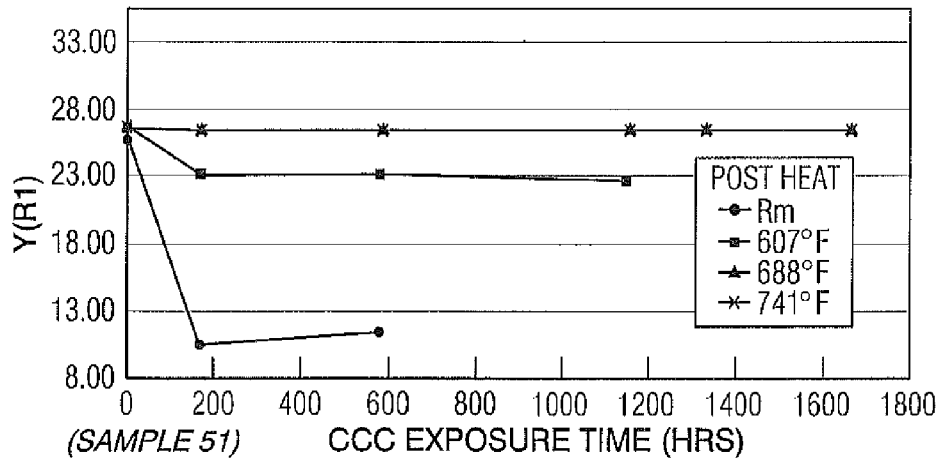
Figure 20:
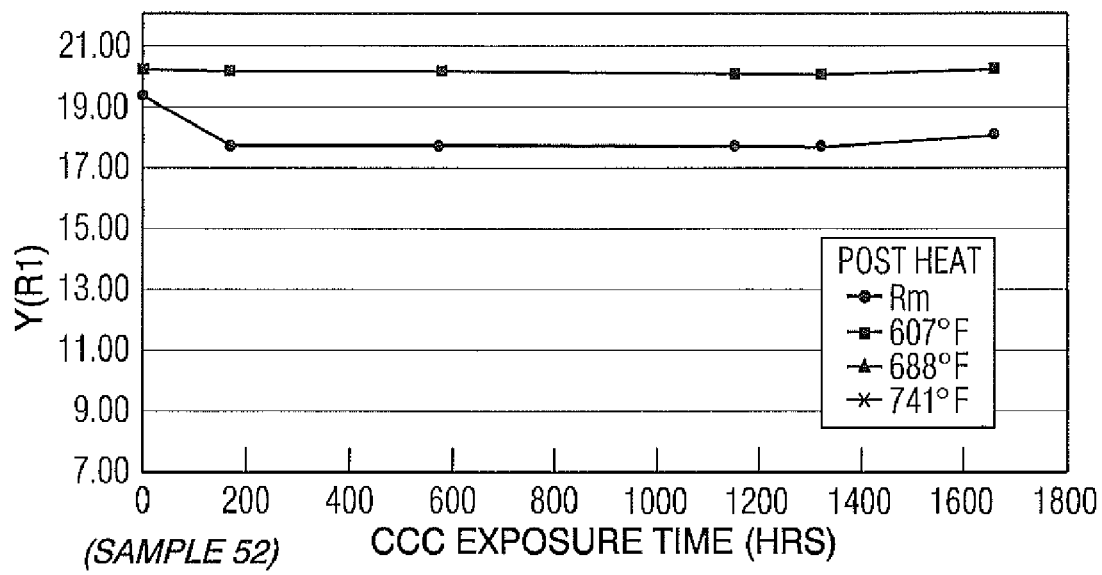
Figure 21:
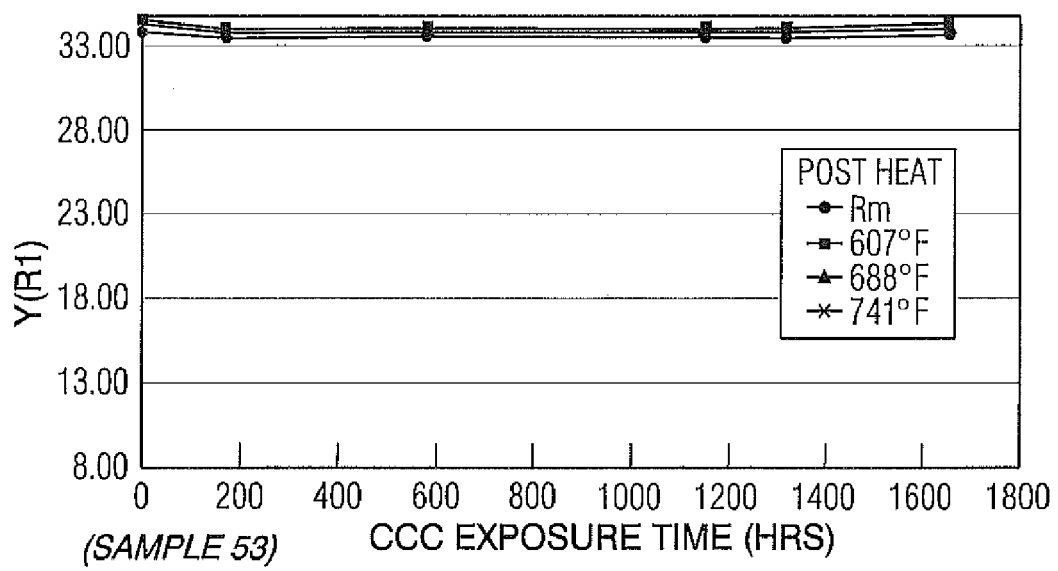
Figure 22:
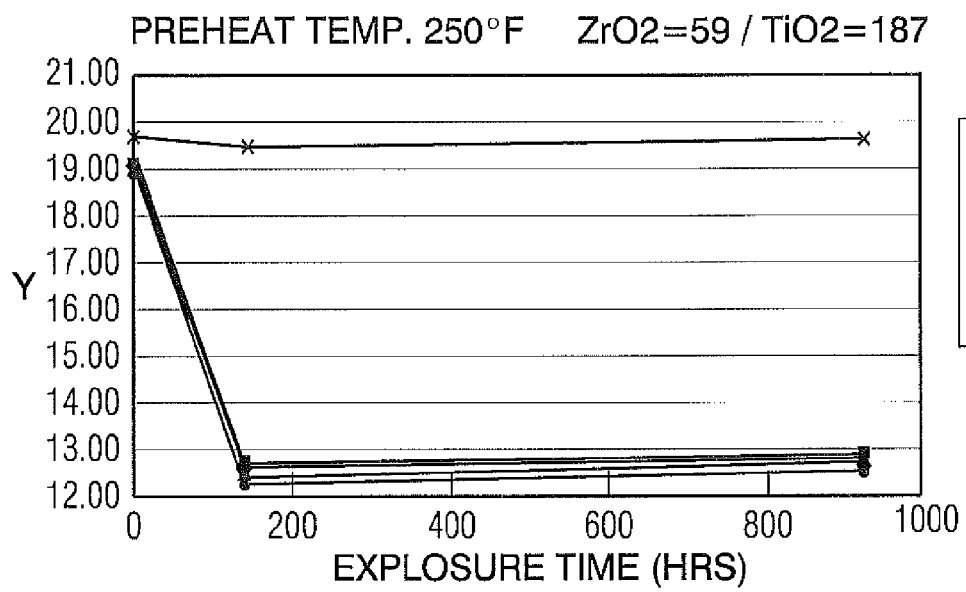
FIGS. 22-24 are graphs showing reflectance versus Cleveland Condensation Test (CCC) exposure time for a coating similar to that of FIG. 10 at preheat temperatures of 250° F. (121° C.), 300° F. (149° C.), and 370° F. (188° C.), respectively.
Figure 23:
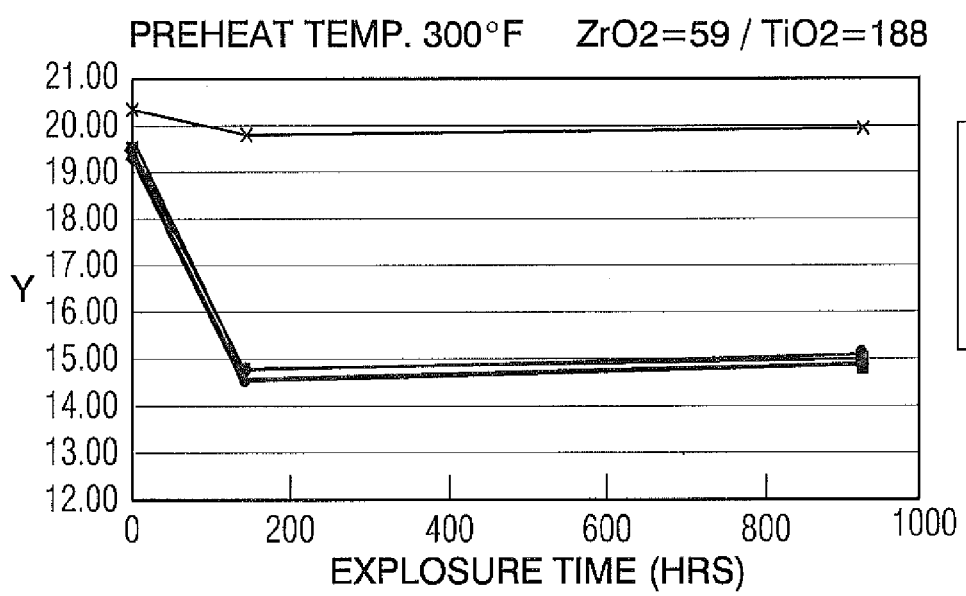

Replicate coatings of Samples 46-53 were also tested in accordance with a conventional Cleveland Condensation Test (CCC) apparatus (Q.C.T. Condensation Tester commercially available from the Q-Panel Company of Cleveland, Ohio). The degree of coating degradation was determined by measuring the reflectance (expressed in terms of the tristimulus value and designated Y or Y(R1) in the Figs.) of the coating using a commercially available BYK-Gardner TCS Meter. The results are shown in FIGS. 14-21. As shown in FIGS. 14 and 15, Samples 46 and 47 (titania alone; no preheat) showed poor CCC results. As used herein, "poor" means that the coating did not survive the CCC test for more than 400 hours as evidenced by a drop in the observed reflectance indicating a degradation of the coating. Samples 48 and 49 (titania alone; with preheat) in FIGS. 16 and 17 showed somewhat better results. However, Samples 50 and 51 (zirconia/titania; no preheat) in FIGS. 18 and 19 showed better CCC results than the titania coatings without preheat. Surprisingly, Samples 52 and 53 (zirconia/titania; with preheat) in FIGS. 20 and 21 showed markedly improved CCC results over titania coatings with preheat. For example, Sample 53 (FIG. 21) not only provided a coating with photoactive hydrophilicity less than 10° after 40 minutes exposure to UV radiation (340 nm at an intensity of 24 w/m$^2$) even with no post-heating, but also had surprisingly good CCC results.

Figure 24:
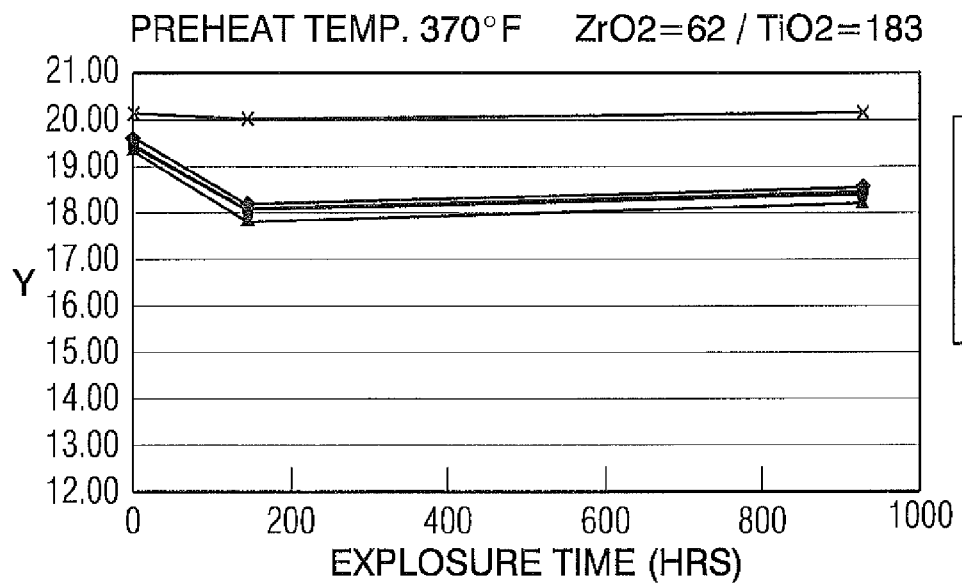
Figure 25:
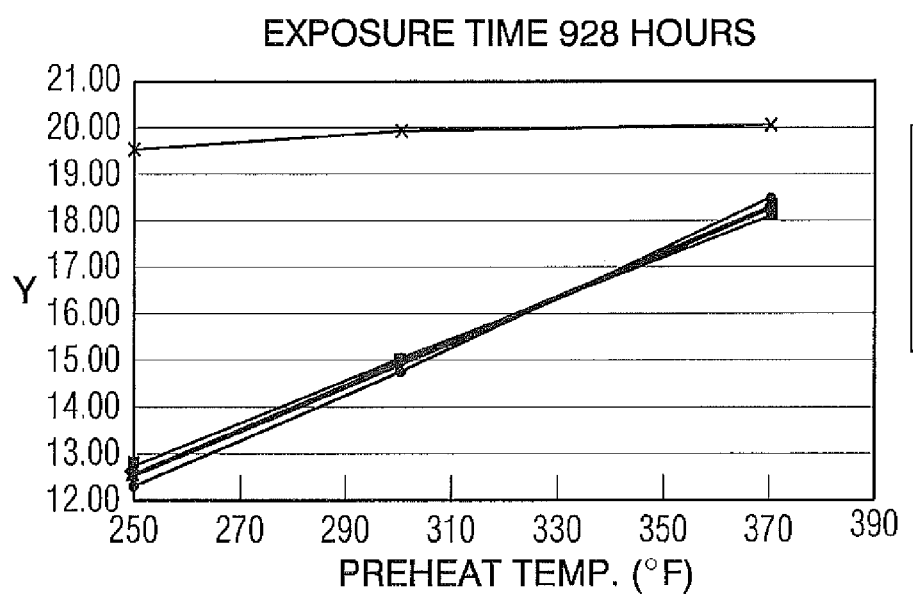
FIG. 25 is a graph showing CCC reflectance results versus preheat temperatures for coatings similar to that shown in FIG. 10.

FIGS. 22-25 show the results of the CCC test for a replicate coating of Sample 52 for post-heat temperatures of 261° F. (127° C.), 388° F. (198° C.), 495° F. (257° C.), 561° F. (294° C.), and room temperature for preheat temperatures of 250° F. (121° C.) (FIG. 22), 300° F. (149° C.) (FIG. 23), and 370° F. (188° C.) (FIG. 24). From these results, it appears that as the preheat temperature increases, post-heating has less and less effect on the chemical durability of the coating. FIG. 25 shows that for this coating, if the substrate is heated to about 370° F. (188° C.), post-heating below about 561° F. (294° C.) appears to have little or no affect on the chemical durability of the coating.

FEATURE 4 (Photocatalysis)

Some of the coatings of the invention were measured for photocatalytic activity in accordance with the standard stearic acid test. Table VI shows the results for those measurements having a statistical R$^2$ value of greater than 0.93. The photocatalytic activity values are in units of centimeter$^{-1}$/min (cm$^{-1}$/min).

TABLE VI

| Sample | Post-heat (° C.) | Photocatalytic Activity |
|--------|------------------|-------------------------|
| 49     | 303              | 0.0031                  |
| 48     | 303              | 0.0038                  |
| 52     | 243              | 0.0024                  |
| 52     | 303              | 0.0025                  |

As can be seen from Table VI, the tested coatings show photocatalytic activity under the conditions evaluated. For the other samples tested for photocatalytic activity, the results showed an R$^2$ value of less than 0.93, making the results not statistically valuable and, hence, those values are not listed.

FEATURE 5 (Pyrolytic Deposition)

In another aspect of the invention, photoactive coatings (e.g., photoactively hydrophilic coatings) can be deposited using conventional pyrolytic deposition techniques.

In one example, a piece of clear float glass (4.8 mm thick by 10.5 mm square) commercially available from PPG Industries, Inc. of Pittsburgh, Pa. was heated in a 1200° F. (648° C.) oven for 8 minutes. The glass piece was removed from the oven and a portion of the glass was sprayed for 4 seconds with an aqueous zirconium acetylacetonate ($Zr(C_5H_7O_2)_4$) solution commercially available from Johnson Matthey Company. The coated glass piece was then reinserted into the 648° C. oven for 8 minutes. It is estimated that the deposited zirconium acetylacetonate solution was sufficient to form a zirconium dioxide layer having a dry film thickness in the range of 100 Å to 300 Å. Then, the glass piece was removed from the oven, inspected, and reinserted into the 648° C. oven for 8 minutes. After which, the glass piece was removed from the oven and the portion of the glass piece previously coated with zirconium dioxide was sprayed for 4 seconds with an aqueous titanium acetylacetonate ($TiO(C_5H_7O_2)_2$) solution commercially available from Amspec Corporation. The glass was reinserted into the 648° C. oven for another 8 minutes. It is estimated that the deposited titanium acetylacetonate was sufficient to form a titanium dioxide layer having a thickness in the range of 100 Å to 300 Å over the previously deposited zirconium dioxide layer. After 8 minutes, the glass piece was removed from the 648° C. oven, inspected, and then reinserted into the oven for a final 8 minutes of heating. The glass piece was then removed from the oven and allowed to cool to room temperature. Although the zirconium dioxide and titanium dioxide layers were deposited as individual layers, i.e., using separate deposition steps, the subsequent heating of the coated substrate may have caused some mixing or blending of the two components, e.g., at the area of the interface between the two layers.

Figure 26:
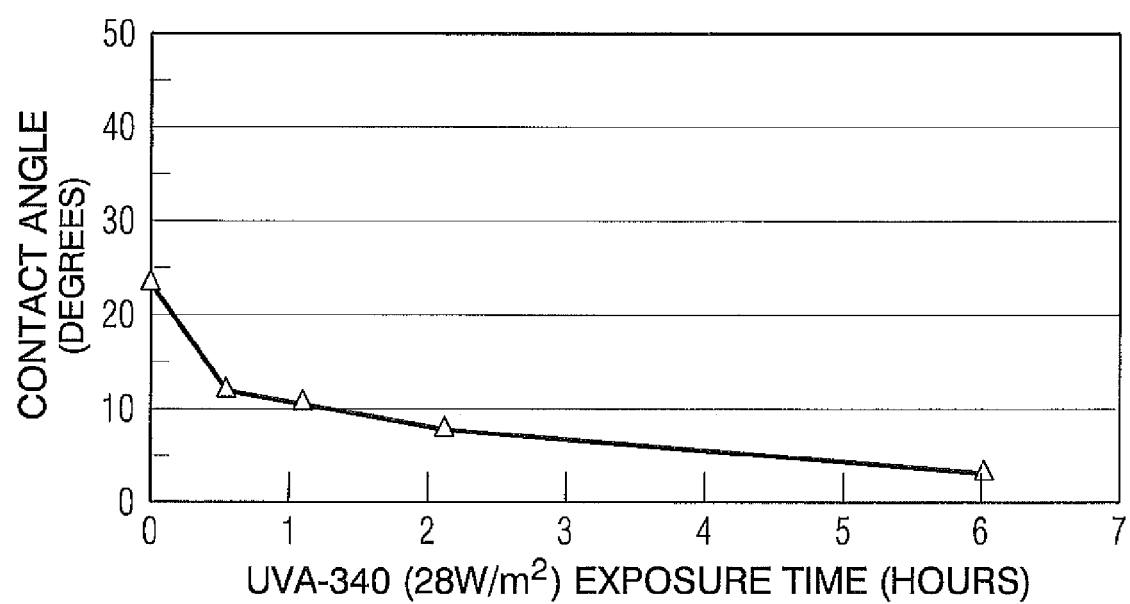
FIG. 26 is a graph of contact angle versus UV exposure time for the Example described in Feature 5 of the specification.

The coated substrate was subsequently tested for photoactivity, particularly photoactive hydrophilicity. First, the coated glass was cleaned by wiping with a Kaydry® wipe wetted with a 50/50 volume percent solution of 2-propanol and deionized water. Next, the coated glass was wiped with a TechniCloth® wipe wetted with hop tap water, rinsed with deionized water, blown dry with compressed nitrogen, and irradiated with a commercially available germicidal UV light for 1.5 hours. After this cleaning procedure, three drops of water were placed on the coated glass and the contact angle of the water drops measured. The water drops on the coated glass had an average measured contact angle of 4° with a standard deviation of 1. The coated glass was placed into a closed polycarbonate box for 60 hours. After which, the contact angles of three water drops on the coated glass were again measured. The average measured contact angle of the water drops was 24° with a standard deviation of 2. Next, the coated glass was irradiated with UV radiation from a UVA-340 light source at an intensity of 28 W/m$^2$ at the coating surface and the contact angle of three water droplets on the coated glass was measured over time. The results of these contact angle measurements are shown in FIG. 26. As can be seen from the figure, the water drop contact angles decreased from about 24° initially to 10° (with a standard deviation of 3) after about 1 hour of exposure to the UV radiation and decreased to about 7° (with a standard deviation of 1) after 2 hours of exposure to the UV radiation. After 6 hours, the average contact angle was 3° with a standard deviation of 1.

Thus, a photoactively hydrophilic coating was prepared by the pyrolytic deposition of a zirconium oxide/titanium oxide coating stack on the glass substrate.

It will be readily appreciated by those skilled in the art that modifications may be made to the invention without departing from the concepts disclosed in the foregoing description. Accordingly, the particular embodiments described in detail herein are illustrative only and are not limiting to the scope of the invention, which is to be given the full breadth of the appended claims and any and all equivalents thereof.

What is claimed is:

1. A method of making a transparency, comprising the steps of:
    providing a glass substrate having at least one surface;
    pyrolytically depositing a first continuous film comprising zirconium oxide in the cubic, baddeleyite or orthorhombic crystalline phase directly on substantially all of the glass substrate surface; and
    pyrolytically depositing a second continuous photocatalytic film comprising a material selected from at least one metal oxide or semiconductor metal oxide on substantially all of the first film.

2. The method of claim 1, including heating the substrate to a temperature of at least 400° C. prior to depositing the first film.

3. The method of claim 1, including heating the substrate to a temperature of at least 600° C. prior to depositing the first film.

4. The method of claim 1, including heating the substrate such that the substrate has a temperature of at least 400° C. prior to at the beginning of the second depositing step.

5. The method of claim 1, including heating the substrate such that the substrate has a temperature of at least 600° C. at the beginning of the second depositing step.

6. The method of claim 1, wherein the first continuous film has a dry film thickness greater than 100 Å.

7. The method of claim 1, wherein the first continuous film has a dry film thickness in the range of 100 Å to 500 Å.

8. The method of claim 1, wherein the second continuous film has a dry film thickness greater than 100 Å.

9. The method of claim 1, wherein the second continuous film has a dry film thickness in the range of 100 Å to 500 Å.

10. The method of claim 1, wherein the second continuous layer is in direct contact with the first continuous layer.

11. A method of making a transparency, comprising:
    providing a glass substrate having at least one surface;
    pyrolytically depositing a first continuous layer comprising zirconium oxide in the cubic, baddeleylte or orthorhombic crystalline phase directly on substantially all of the substrate; and
    pyrolytically depositing a second continuous photocatalytic layer comprising titanium oxide on substantially all of the first layer.

12. The method of claim 11, wherein the first layer has a thickness greater than 100 Å.

13. The method of claim 11, wherein the second layer is in direct contact with the first layer.

14. The method of claim 11, wherein the second layer has a thickness greater than 100 Å.

15. A method of making a coated substrate, comprising:
    providing a glass substrate having at least one surface; pyrolytically depositing a first continuous layer comprising zirconium oxide in the cubic, baddeleyite or orthorhombic crystalline phase in contact with at least a portion of the glass substrate surface; and
    depositing a second continuous photocatalytic layer comprising a material selected from at least one metal oxide or semiconductor metal oxide on substantially all of the first layer.

* * * * *